(12) United States Patent
Hisada et al.

(10) Patent No.: US 8,243,491 B2
(45) Date of Patent: Aug. 14, 2012

(54) SEMICONDUCTOR INTEGRATED CIRCUIT INCLUDING SEMICONDUCTOR MEMORY

(75) Inventors: Toshiki Hisada, Yokohama (JP); Hiromitsu Mashita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 92 days.

(21) Appl. No.: 12/884,378

(22) Filed: Sep. 17, 2010

(65) Prior Publication Data

US 2011/0176347 A1 Jul. 21, 2011

(30) Foreign Application Priority Data

Jan. 20, 2010 (JP) ................................. 2010-010434

(51) Int. Cl.
*G11C 5/06* (2006.01)
(52) U.S. Cl. ........................................................ 365/72
(58) Field of Classification Search ................. 365/2.07, 365/72
See application file for complete search history.

(56) References Cited

FOREIGN PATENT DOCUMENTS

JP 2009-141222 6/2009

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a memory cell array includes memory cells arranged at crossing points of bit lines and word lines. The bit lines include first, second, third, and fourth bit lines sequentially arranged. A first sense circuit is arranged on a first end side of the memory cell array, electrically connected to the first and third bit lines. A second sense circuit is arranged on a second end side of the memory cell array, electrically connected to the second and fourth bit lines. A first hookup region is arranged between the memory cell array and the first sense circuit and includes a first transfer transistor connected to the first bit line and the first sense circuit. A second hookup region is arranged between the first hookup region and the first sense circuit and includes a second transfer transistor connected to the third bit line and the first sense circuit.

9 Claims, 20 Drawing Sheets

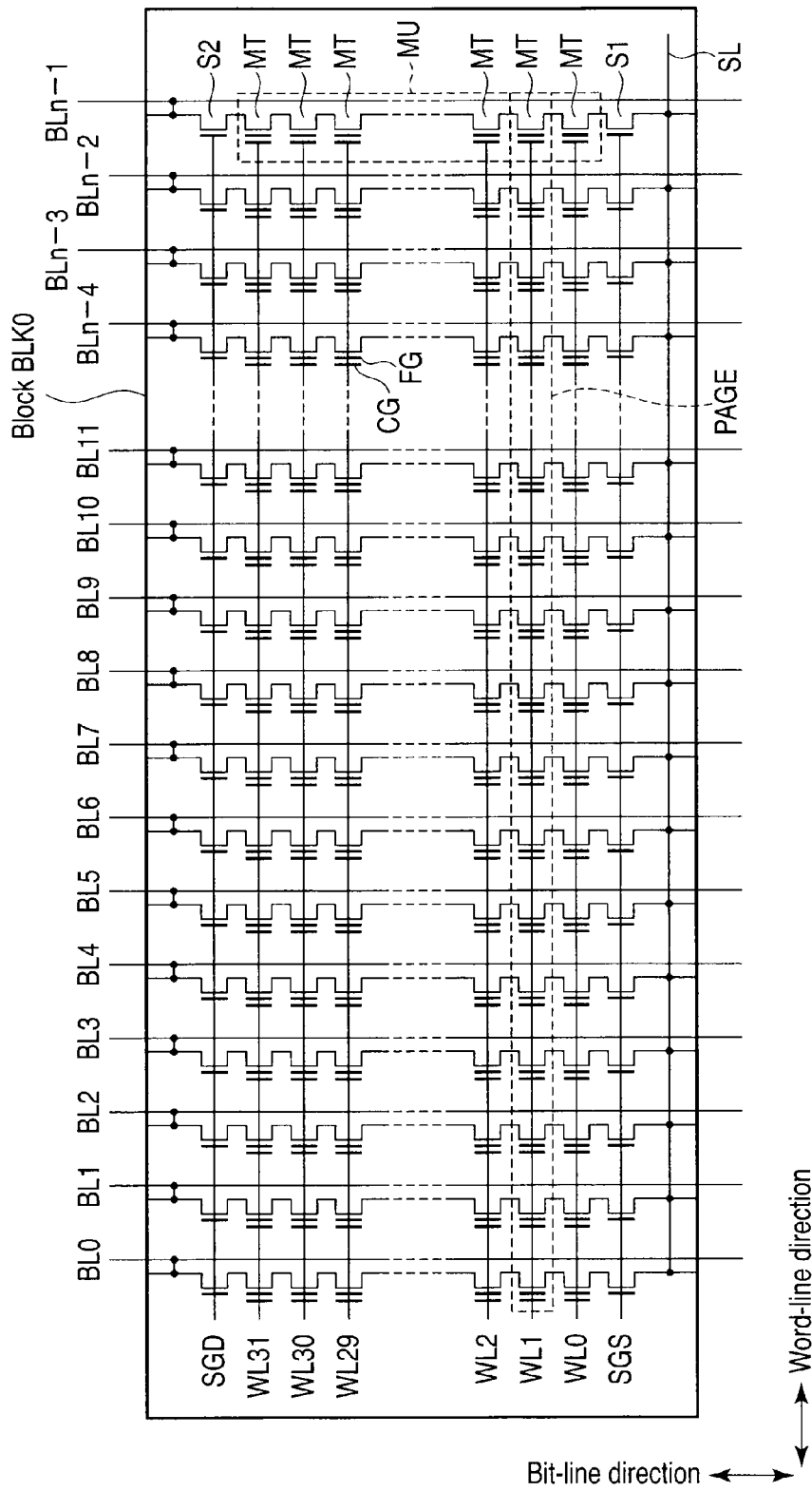
F I G. 2

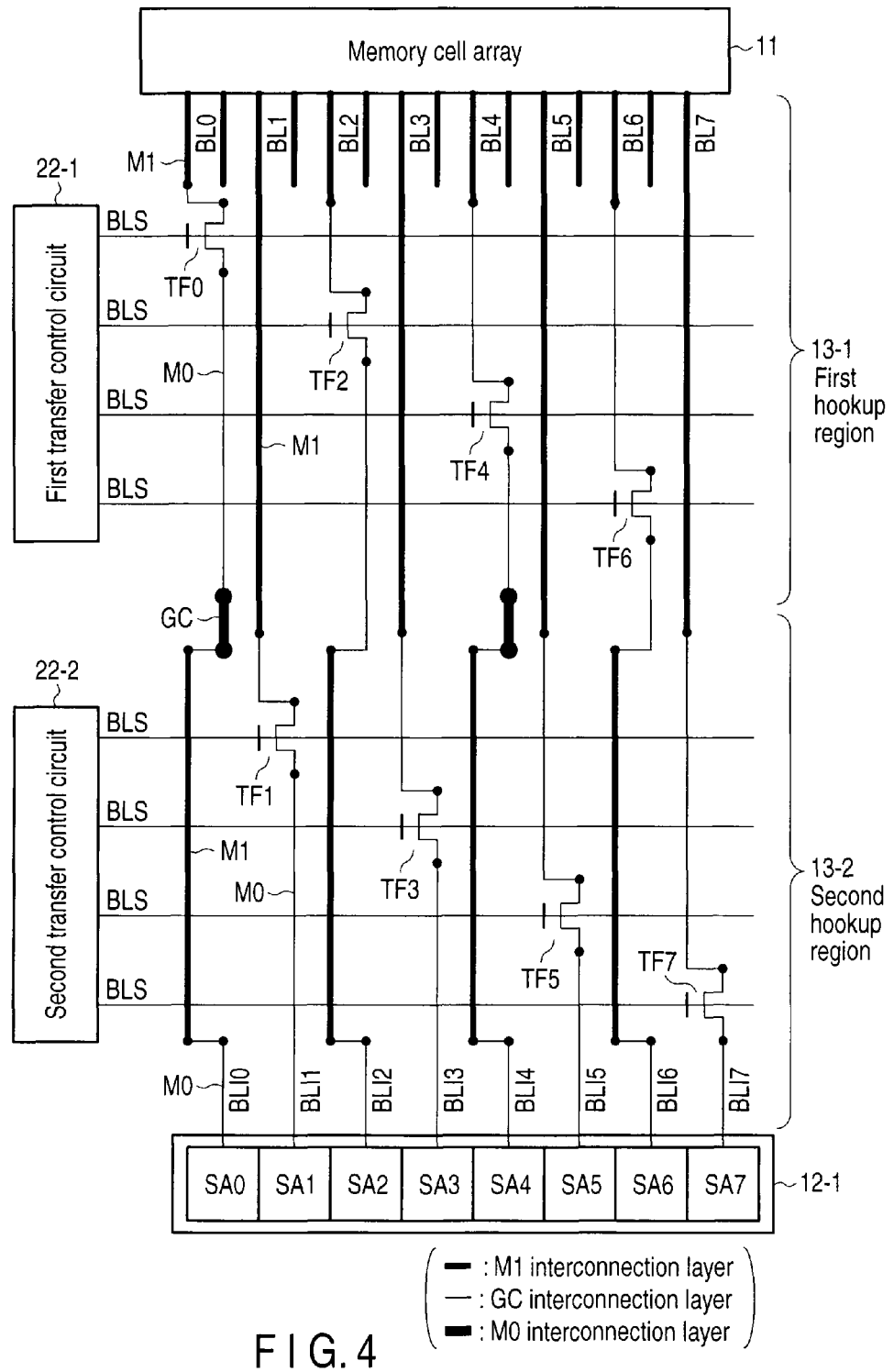
F I G. 4

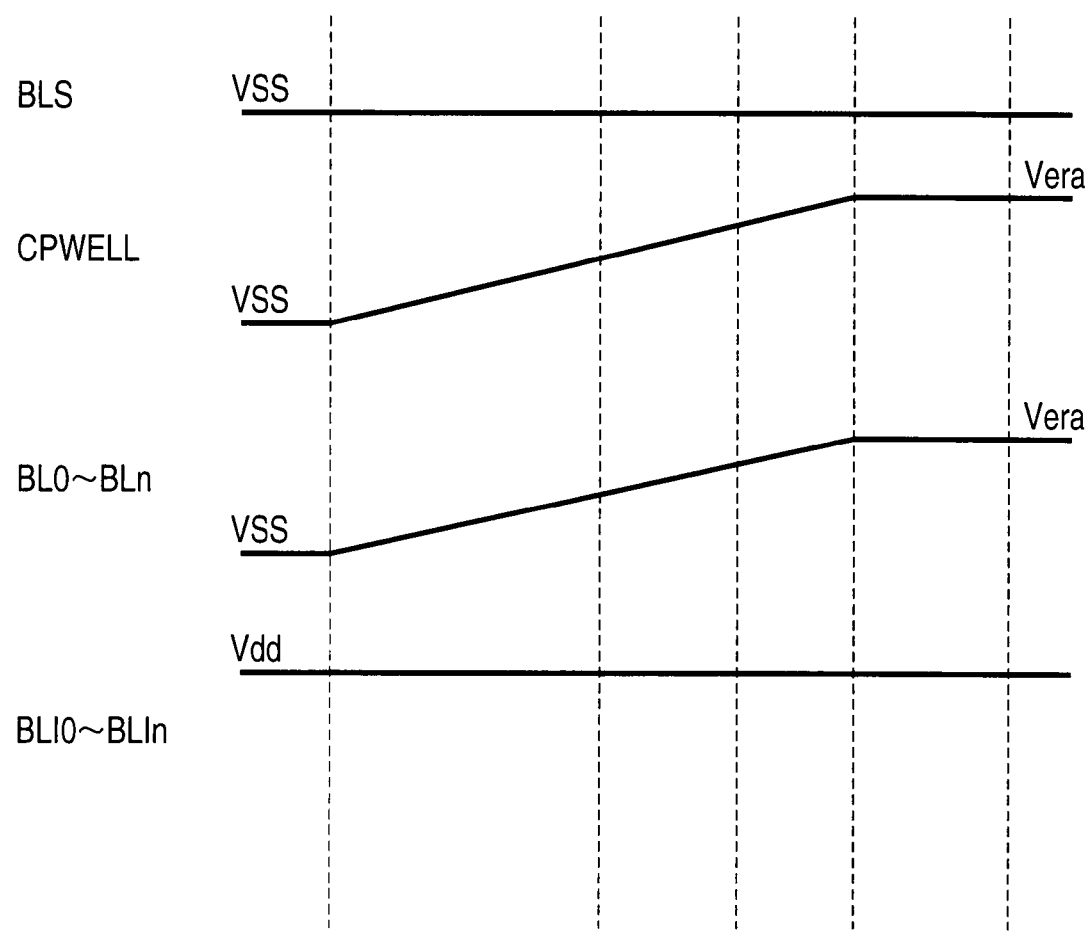
F I G. 12

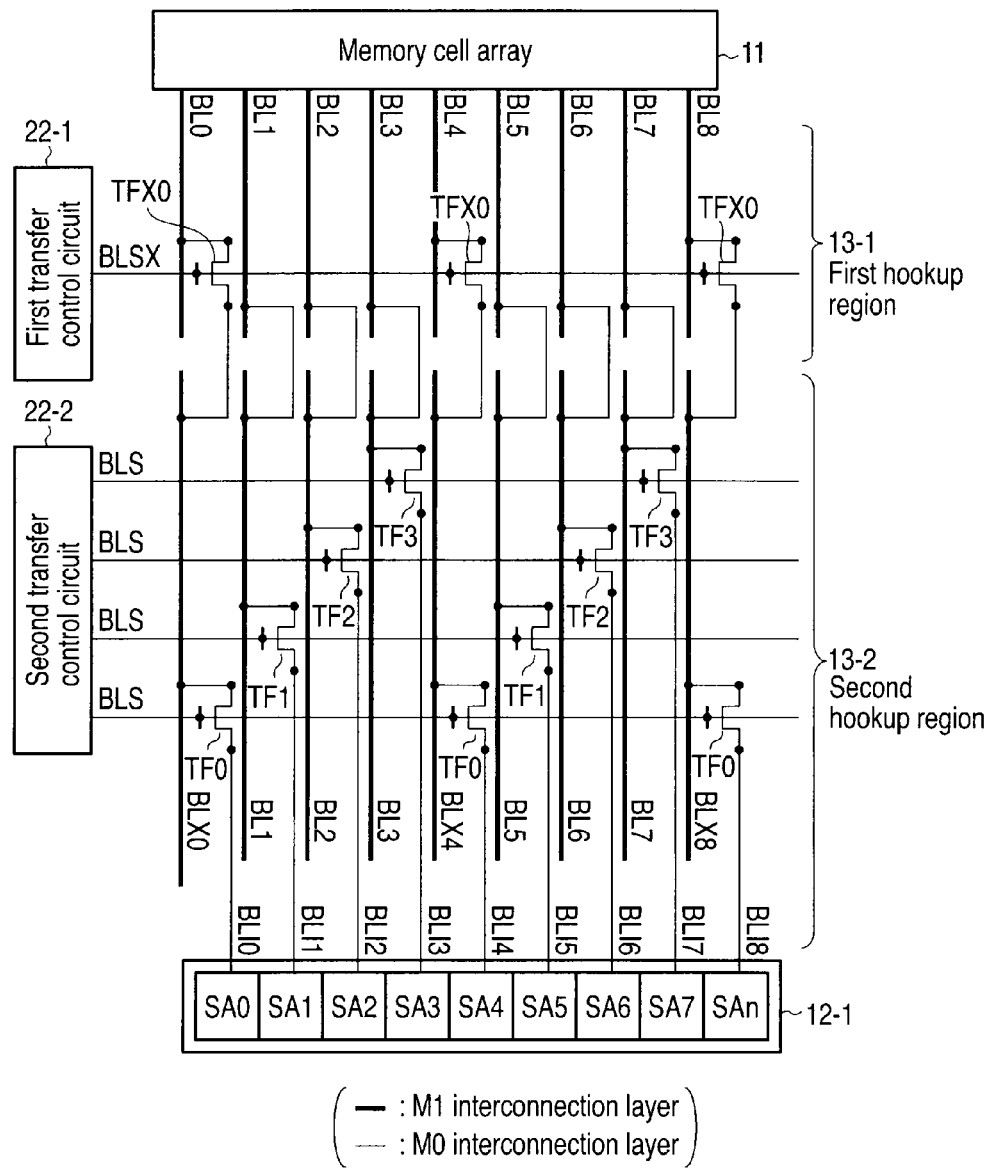
F I G. 1 4

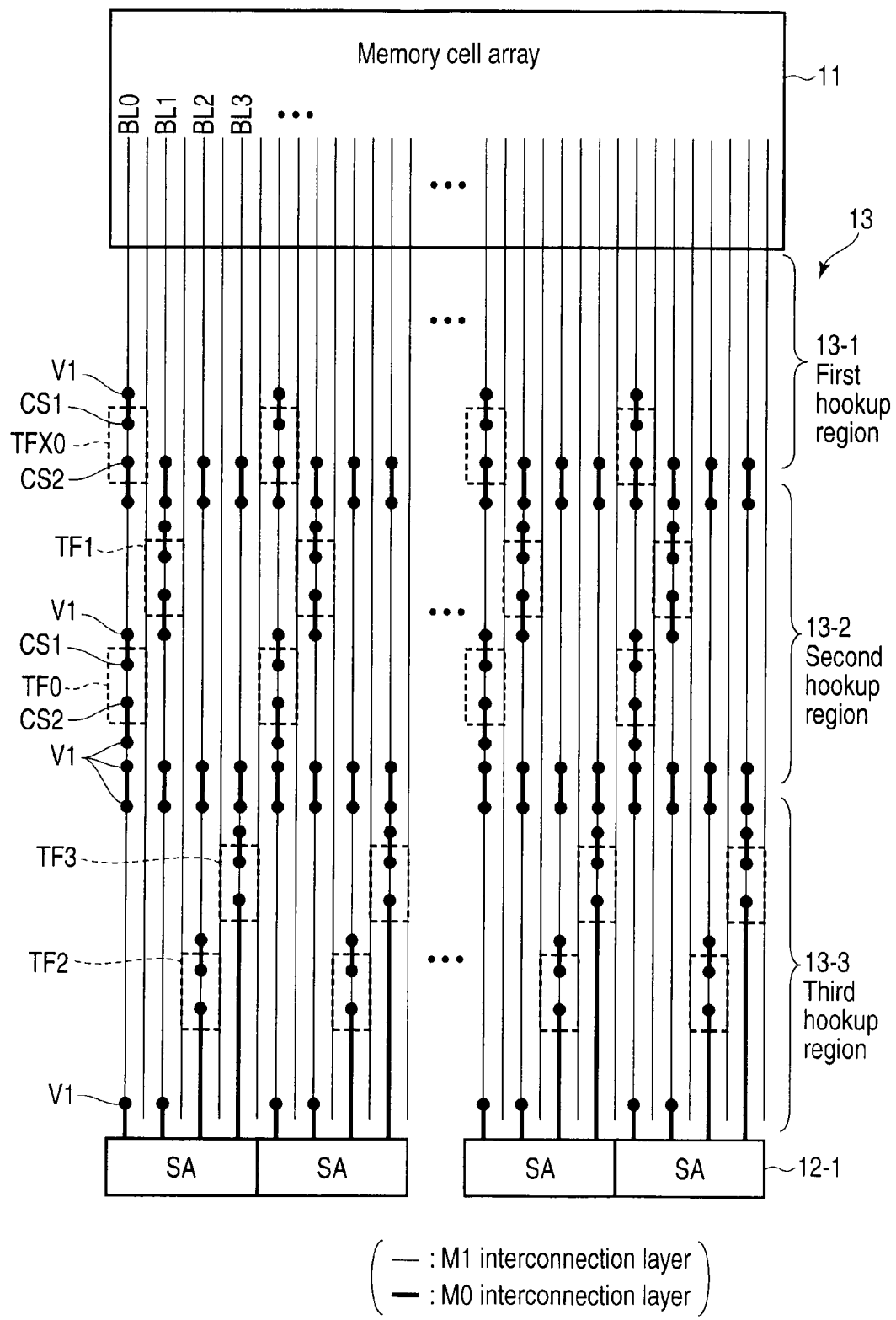
F I G. 1 5

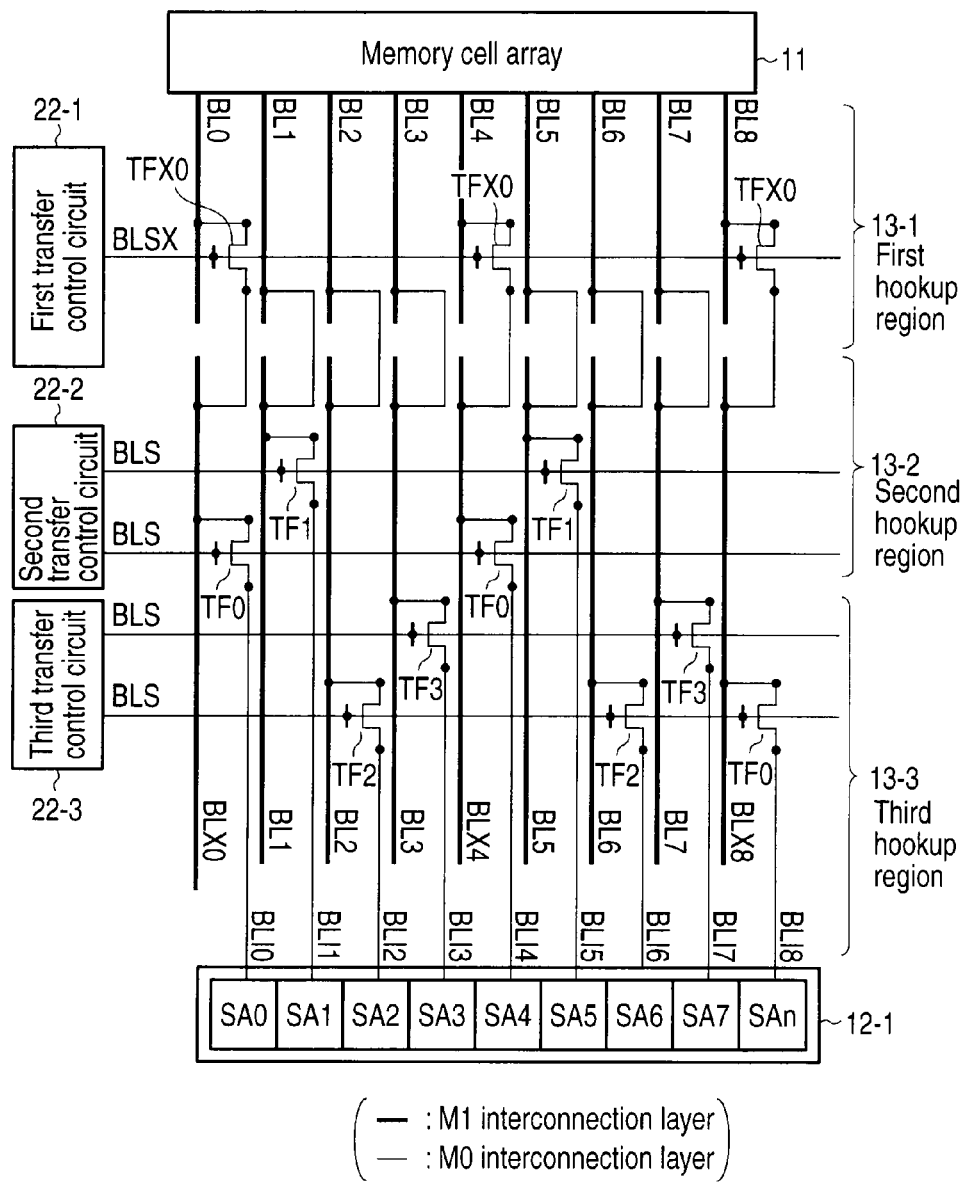
F I G. 16

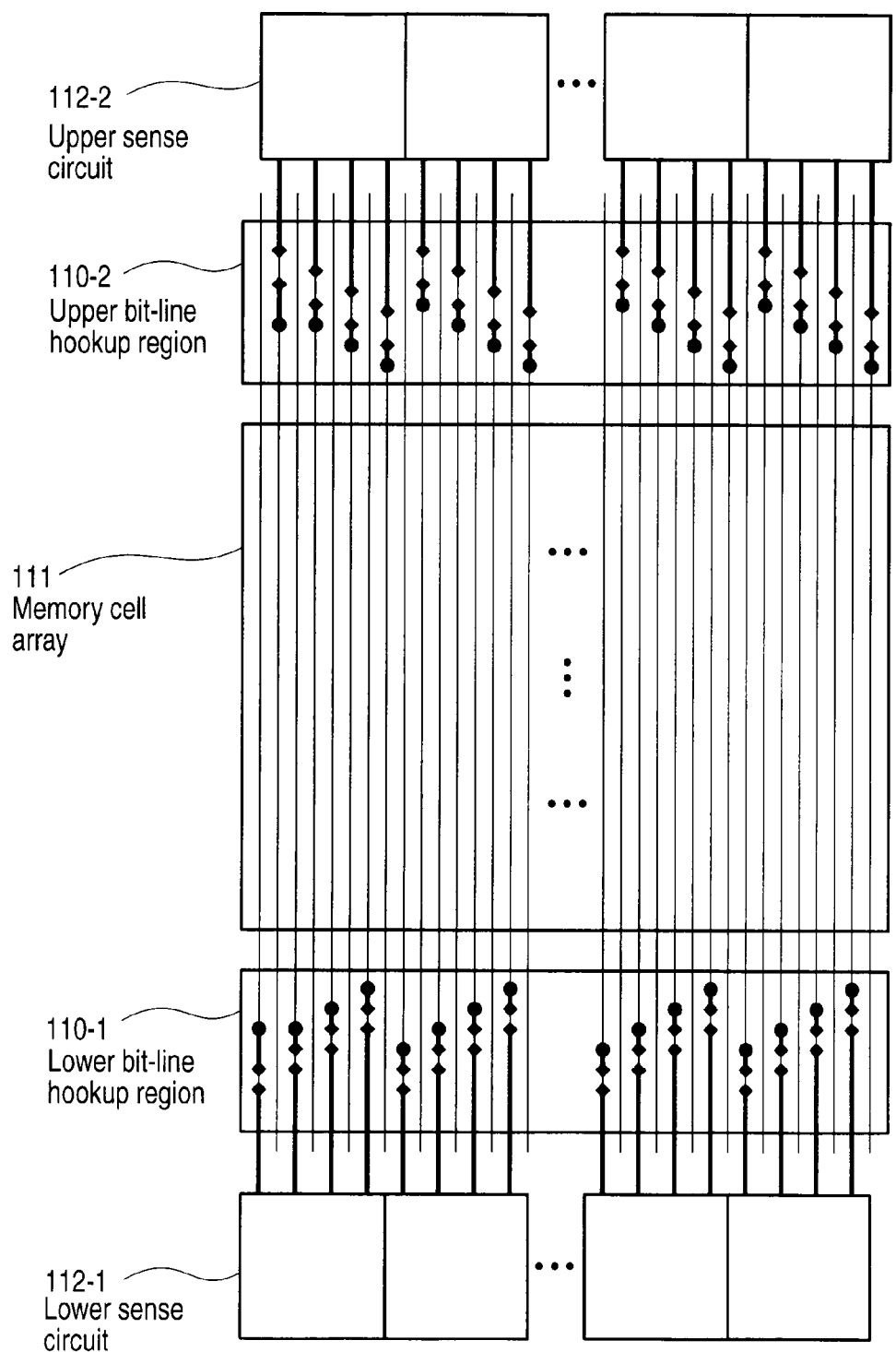
F I G. 17

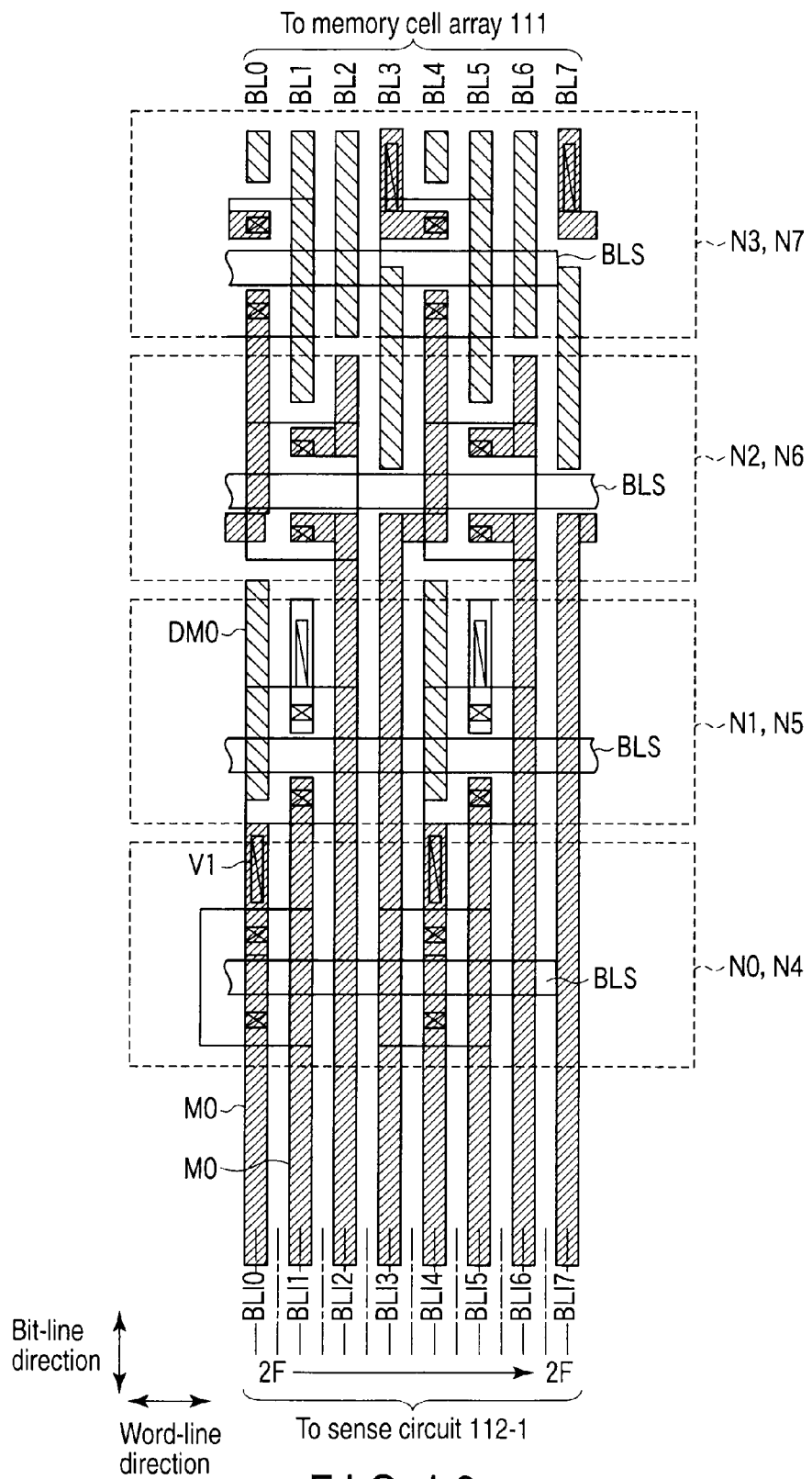
F I G. 19

SEMICONDUCTOR INTEGRATED CIRCUIT INCLUDING SEMICONDUCTOR MEMORY

CROSS-REFERENCE TO RELATED APPLICATIONS

This application is based upon and claims the benefit of priority from Japanese Patent Application No. 2010-010434, filed Jan. 20, 2010; the entire contents of which are incorporated herein by reference.

FIELD

Embodiments described herein relate generally to a semiconductor integrated circuit, for example, a bit-line hookup circuit in a NAND flash memory.

BACKGROUND

In recent years, electronic devices using NAND flash memory for main storage have been produced in great number. As such electronic devices become increasingly multifunctional, increased storage capacity of NAND flash memory becomes a problem to be addressed (for example, Jpn. Pat. Appln. KOKAI Publication No. 2009-141222).

In order to achieve an increase in storage capacity, chip layout is very important. For example, although miniaturization of a memory cell markedly progresses, in order to solve problems such as disconnection, short-circuit, and the like of conductive lines to improve reliability, sizes or pitches of the shapes of conductive lines and contact holes need to be determined in consideration of difficulty of photolithography and withstand voltages between the conductive lines.

In particular, even though bit lines are formed with a minimum processing dimension using line-and-space patterns, in order to connect a switch element called a bit-line hookup circuit to a bit line, a layout or the like need to be sufficiently devised such that a conductive line is connected with curvature. For example, an increase of a random pattern to be compensated for needs to be suppressed in terms of photolithography. Furthermore, in terms of miniaturization of interconnection pitch, the withstand voltage of a conductive line needs to be secured.

Therefore, an examination of a layout in a bit-line hookup circuit is necessary for securing a margin of photolithography, assurance of withstand voltage between interconnection layers, reduction of chip size, and increase in storage capacity.

However, when miniaturization progresses, in the configuration of a conventional bit-line hookup circuit, the following problem arises.

For example, in a NAND flash memory, in a data erasing operation, a potential difference between interconnection layers in a bit-line hookup circuit is 20 V or more, and a leakage current is generated between the interconnection layers. For this reason, a withstand voltage of the interconnection layer cannot be assured.

In particular, in interconnection layers in a bit-line hookup circuit, when the interconnection layer approaches a sense circuit, the density of conductive lines on the interconnection layer increases. For this reason, it is difficult to secure a margin while securing a distance which satisfies a specification of a withstand voltage.

As described above, in a conventional semiconductor integrated circuit, when miniaturization progresses, a withstand voltage between interconnection layers in a bit-line hookup circuit cannot be assured, and a margin for photolithography cannot be secured.

BRIEF DESCRIPTION OF THE DRAWINGS

FIG. 2 is a circuit diagram showing a configuration of a block in the semiconductor integrated circuit according to the first embodiment;

FIG. 4 is a circuit diagram showing a layout and a circuit configuration in first and second hookup regions in the semiconductor integrated circuit according to the first embodiment;

FIG. 12 is a timing chart of a bit-line hookup circuit in an erasing operation in the semiconductor integrated circuit according to the first embodiment;

FIG. 14 is a circuit diagram showing a configuration of a bit-line hookup circuit in the second embodiment;

FIG. 15 is a schematic diagram showing a layout of a memory cell array, a sense circuit, and a bit-line hookup circuit in the semiconductor integrated circuit according to a modification of the second embodiment;

FIG. 16 is a circuit diagram showing a configuration of a bit-line hookup circuit in a modification of the second embodiment;

FIG. 17 is a schematic diagram showing a layout in a semiconductor integrated circuit of a comparative example;

FIGS. 19 and 20 are a layout diagram of a hookup region in the semiconductor integrated circuit of the comparative example.

DETAILED DESCRIPTION

Figure 1:
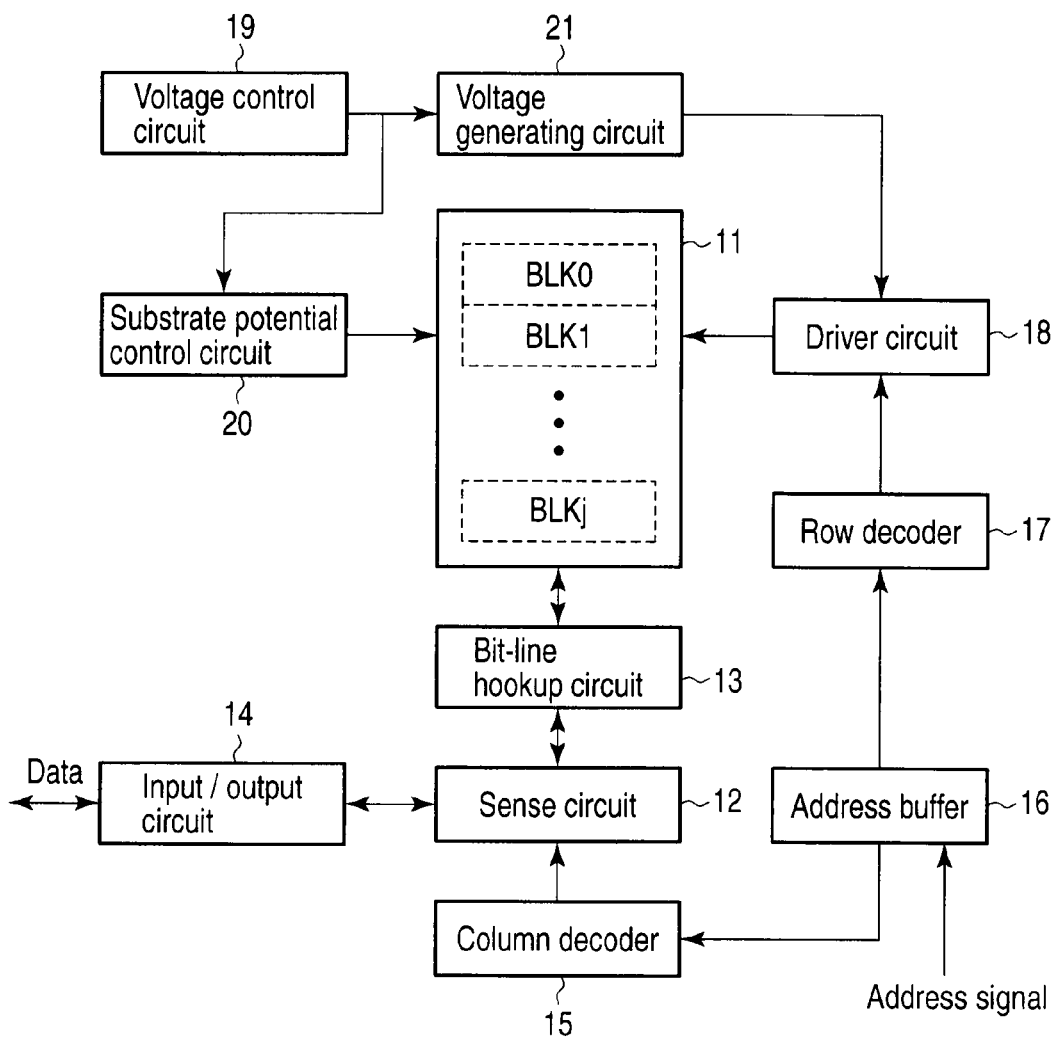
FIG. 1 is a block diagram of a main configuration of a semiconductor integrated circuit according to a first embodiment.

A semiconductor memory device according to an embodiment will be described below with reference to the accompanying drawings. In this case, a OneNAND is exemplified as a semiconductor memory device. In the explanation, throughout all the drawings, common reference numerals denote common parts, respectively.

In general, according to one embodiment, a semiconductor integrated circuit includes a memory cell array, a first sense circuit, a second sense circuit, a first hookup region and a second hookup region. The memory cell array includes a plurality of memory cells arranged at crossing points of a plurality of bit lines and a plurality of word lines in a form of a matrix. The bit lines include first, second, third, and fourth bit lines sequentially arranged adjacent to one another. The first sense circuit is arranged on a first end side of the memory cell array, electrically connected to the first and third bit lines, and reads data from the memory cell. The second sense circuit is arranged on a second end side of the memory cell array, electrically connected to the second and fourth bit lines, and reads data from the memory cell. The first hookup region is arranged between the memory cell array and the first sense circuit. The first hookup region includes a first transfer transistor including a first current path, one end of the first current path being connected to the first bit line, the other end of the first current path being electrically connected to the first sense circuit. The second hookup region is arranged between the first hookup region and the first sense circuit. The second hookup region includes a second transfer transistor including a second current path, one end of the second current path being connected to the third bit line, the other end of the second current path being electrically connected to the first sense circuit.

A semiconductor integrated circuit according to an embodiment of the present invention will be described below with reference to the accompanying drawings. In this case, a NAND flash memory is exemplified as a semiconductor integrated circuit. In the explanation, throughout all the drawings, common reference numerals denote common parts, respectively.

[1] First Embodiment

A NAND flash memory according to a first embodiment of the present invention will be described.

[1-1] Overall Configuration of NAND Flash Memory

FIG. 1 is a block diagram of a main configuration of the NAND flash memory according to the first embodiment.

As shown in FIG. 1, the NAND flash memory according to the embodiment comprises a memory cell array 11, a sense circuit 12, a bit-line hookup circuit 13, an input/output (I/O) circuit 14, a column decoder 15, an address buffer 16, a row decoder 17, a driver circuit 18, a voltage control circuit 19, a substrate potential control circuit 20, and a voltage generating circuit 21.

The memory cell array 11 is configured by a plurality of blocks BLK0, BLK1, . . . , BLKj. Each of the plurality of blocks BLK0, BLK1, . . . , BLKj comprises a plurality of memory cell units. Each of the memory cell units is configured by a NAND string comprising a plurality of memory cells connected in series with each other. The memory cell unit is selected by two select gate transistors connected to both the ends of the NAND strings, respectively.

The sense circuit 12 reads data from the memory cell in the memory cell array 11. Although not shown, the sense circuit 12 comprises a data latch circuit. The data latch circuit has a function of temporarily latching data in a read/write state, and is configured by, for example, a flipflop circuit or the like.

The bit-line hookup circuit 13 is a circuit which is arranged between the memory cell array 11 and the sense circuit 12 to connect a bit line serving as an M1 interconnection layer to a connection line serving as an M0 interconnection layer lower than the M1 interconnection layer. In this case, the reference symbols Mn (n=0, 1, . . . ) denote interconnection layers arranged on a semiconductor substrate; the larger the value n, the upper the interconnection layer.

The input/output circuit 14 operates as an interface circuit for data.

The address buffer 16 functions as an interface circuit for an address signal.

The column decoder 15 and the row decoder 17 select a memory cell in the memory cell array 11 based on an address signal.

A driver circuit (word-line driver) 18 drives a selected word line in a selected block (BLK0, BLK1, . . . , BLKj).

The control circuit 19 controls operations of, for example, the substrate voltage control circuit 20 and a voltage generating circuit 21.

The substrate voltage control circuit 20 controls a voltage of the semiconductor substrate. More specifically, when a double well region configured by an n-type well region and a p-type well region is formed in a p-type semiconductor substrate and a memory cell is formed in the p-type well region, a voltage of the p-type well region is controlled depending an operation mode. For example, the substrate voltage control circuit 20, in a read/write state, sets the p-type well region to 0 V, and sets the p-type well region to 15 V or more and 40 V or less in an erase state.

The voltage generating circuit 21 generates a voltage supplied to a word line in the selected block. For example, in the read state, the voltage generating circuit 21 generates a read voltage and an intermediate voltage (read pass voltage). The read voltage is given to the selected word line in the selected block, and an intermediate voltage is given to a nonselected word line in the selected block. In the write state, the voltage generating circuit 21 generates a write voltage and an intermediate voltage (write pass voltage). The write voltage is given to the selected word line in the selected block, and the intermediate voltage is given to the nonselected word line in the selected block.

[1-2] Configuration of Block

A configuration of the blocks (BLK0, BLK1, . . . , BLKj) in the memory cell array 11 according to the first embodiment will be described below with reference to FIG. 2. In this description, the block BLK0 will be explained as an example. In this case, erasing operations in NAND flash memories are collectively performed in units of blocks. For this reason, the block is an erasing unit.

The block BLK0 is configured by a plurality of memory cell units MU arranged in the word-line direction and select gate transistors S1 and S2 which select the memory cell unit MU.

The memory cell unit MU is configured by a NAND string in which current paths of 32 memory cell transistors MT are connected in series with each other. One end of the current path of the select transistor S1 is connected to one end of the current path of the memory cell unit MU. One end of the current path of the select transistor S2 is connected to the other end of the current path of the memory cell unit MU. In this example, although the memory cell unit MU is configured by the 32 memory cells MT, the memory cell unit MU only needs to be configured by two or more memory cells. The number of memory cells MT is not particularly limited to 32.

The memory cell transistors MT are arranged at crossing points between the plurality of bit lines BL0 to BLn−1 and a plurality of word lines WL0 to WL31, respectively, in the form of a matrix. Each of the memory cell transistors MT has a structure in which a tunnel insulating film, a floating electrode FG, an inter-gate insulating film, and a control electrode CG are sequentially laminated on the semiconductor substrate.

A page (PAGE) is set for each of the word lines WL0 to WL31. In this case, a read operation and a write operation for the NAND flash memory are collectively performed in units of pages (PAGE). For this reason, the pages are reading and writing units.

The other end of the current path of the select transistor S1 is connected to a source line SL. The other end of the current path of the select transistor S2 is connected to a bit line BL.

The word lines WL0 to WL31 extend in the word-line direction, and are commonly connected to the control electrodes CG of the plurality of memory cell transistors MT in the word-line direction. A select gate line SGS extends in the word-line direction, and is commonly connected to the gate electrodes of the plurality of select transistor S1 in the word-line direction. A select gate line SGD also extends in the word-line direction, and is commonly connected to the gate electrodes of the plurality of select transistors S2 in the word-line direction.

The bit lines BL0 to BLn−1 extend in the bit-line direction and are connected to the sense circuit 12 through the bit-line hookup circuit 13 to read data in the memory cell transistors MT.

[1-3] Configuration of Bit-Line Hookup Circuit

A configuration of the bit-line hookup circuit in the NAND flash memory according to the first embodiment will be described below.

Figure 3:
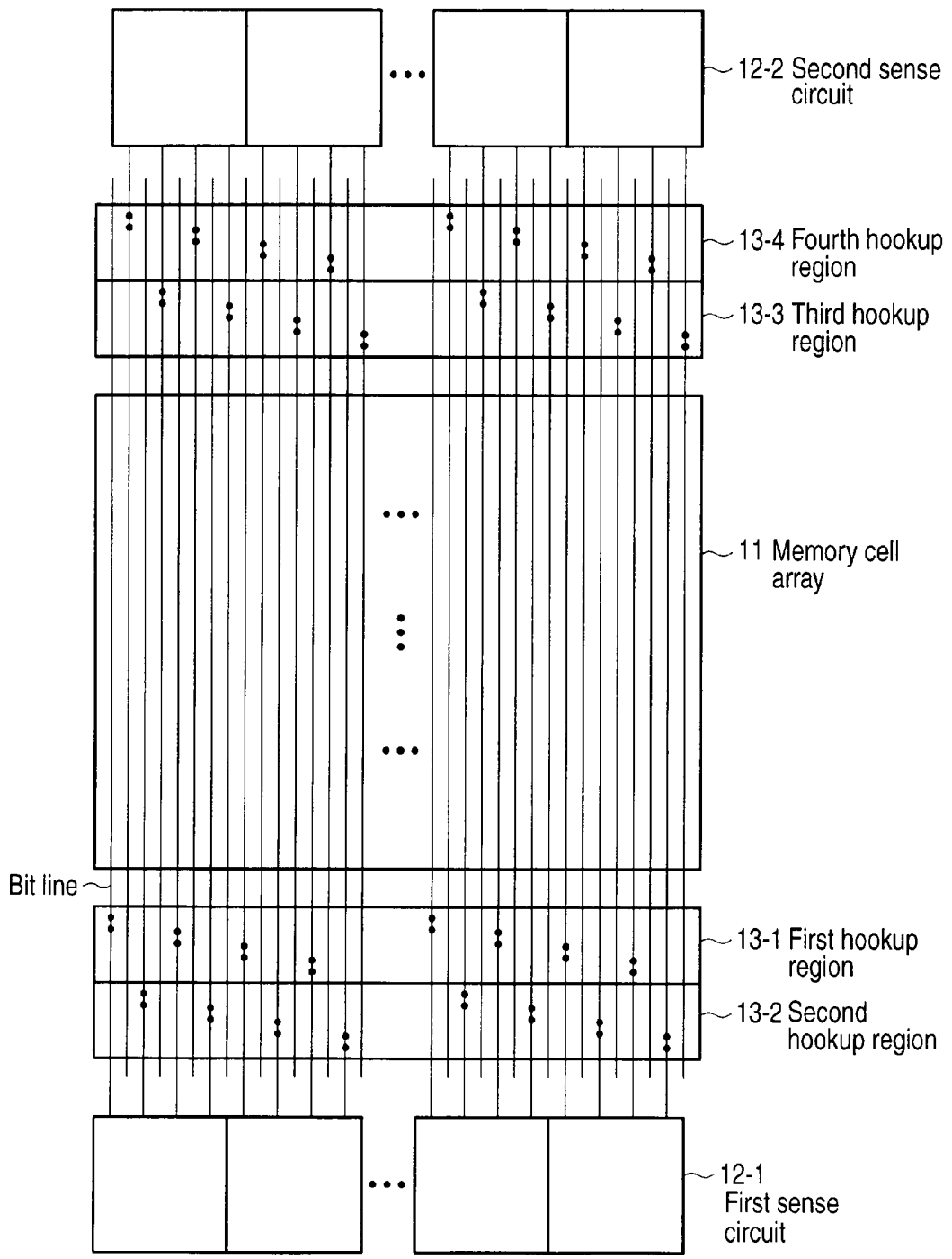
FIG. 3 is a schematic diagram showing a layout of a memory cell array, a sense circuit, and a bit-line hookup circuit in the semiconductor integrated circuit according to the first embodiment.

FIG. 3 is a schematic diagram showing a layout of a memory cell array, a sense circuit, and a bit-line hookup circuit in the NAND flash memory according to the first embodiment.

As shown in FIG. 3, a first sense circuit 12-1 and a second sense circuit 12-2 are arranged at one end and the other end of the memory cell array 11, respectively, to sandwich the memory cell array 11. A first hookup region 13-1 and a second hookup region 13-2 are arranged between the memory cell array 11 and sense circuit 12-1. A third hookup region 13-3 and a fourth hookup region 13-4 are arranged between the memory cell array 11 and sense circuit 12-2.

A plurality of bit lines are aligned in the block of the memory cell array 11. The plurality of aligned bit lines are alternately connected to sense circuit 12-1 and sense circuit 12-2. For example, even-numberth bit lines of the plurality of bit lines are connected to sense circuit 12-1, and odd-numberth bit lines are connected to sense circuit 12-2.

The first hookup region 13-1 and the second hookup region 13-2 arranged between the memory cell array 11 and the sense circuit 12-1 will be described below.

FIG. 4 is a circuit diagram showing a layout and a circuit configuration in the first and second hookup regions in the first embodiment.

The bit-line hookup circuit 13 is configured by the first hookup region 13-1, the second hookup region 13-2, a first transfer control circuit 22-1, and a second transfer control circuit 22-2.

The plurality of bit lines aligned in the block, as described above, are alternately connected to the sense circuit 12-1 and the sense circuit 12-2. In this case, the bit lines connected to the sense circuit 12-1 will be described as the bit lines BL0, BL1, BL2, BL3, . . . , BL7.

The first hookup region 13-1 comprises four transfer transistors TF0, TF2, TF4, and TF6. Transfer transistors TF0, TF2, TF4, and TF6 comprise drains electrically connected to bit lines BL0, BL2, BL4, and BL6 through drain contacts, respectively. The sources of transfer transistors TF0, TF2, TF4, and TF6 are electrically connected to sense amplifiers SA0, SA2, SA4, and SA6 in sense circuit 12-1 through source contacts, respectively.

The second hookup region 13-2 comprises four transfer transistors TF1, TF3, TF5, and TF7. The transfer transistors TF1, TF3, TF5, and TF7 comprise drains electrically connected to the bit lines BL1, BL3, BL5, and BL7 through drain contacts, respectively. The sources of the transfer transistors TF1, TF3, TF5, and TF7 are electrically connected to the sense amplifiers SA1, SA3, SA5, and SA7 in the sense circuit 12-1 through source contacts, respectively.

Connections of the bit lines will be described below in detail.

The bit line BL0 is connected to an internal bit line BLI0 through the transfer transistor TF0 in the first hookup region 13-1, and the internal bit line BLI0 is connected to the sense amplifier SA0. The bit line BL1 is connected to the internal bit line BLI1 through the transfer transistor TF1 in the second hookup region 13-2, and the internal bit line BLI1 is connected to the sense amplifier SA1.

The bit line BL2 is connected to an internal bit line BLI2 through the transfer transistor TF2 in the first hookup region 13-1, and the internal bit line BLI2 is connected to the sense amplifier SA2. The bit line BL3 is connected to an internal bit line BLI3 through the transfer transistor TF3 in the second hookup region 13-2, and the internal bit line BLI3 is connected to the sense amplifier SA3.

The bit line BL4 is connected to an internal bit line BLI4 through the transfer transistor TF4 in the first hookup region 13-1, and the internal bit line BLI4 is connected to the sense amplifier SA4. The bit line BL5 is connected to an internal bit line BLI5 through the transfer transistor TF5 in the second hookup region 13-2, and the internal bit line BLI5 is connected to the sense amplifier SA5.

Furthermore, the bit line BL6 is connected to an internal bit line BLI6 through the transfer transistor TF6 in the first hookup region 13-1, and the internal bit line BLI6 is connected to the sense amplifier SA6. The bit line BL7 is connected to an internal bit line BLI7 through the transfer transistor TF7 in the second hookup region 13-2, and the internal bit line BLI7 is connected to the sense amplifier SA7.

In the first hookup region 13-1, the first transfer control circuit 22-1 is arranged. The first transfer control circuit 22-1 comprises a plurality of control lines BLS, which are connected to the gates of the transfer transistors TF0, TF2, TF4, and TF6, respectively.

The first transfer control circuit 22-1 controls voltages given to the control lines BLS connected to the gates of the transfer transistors TF0, TF2, TF4, and TF6 to control the conduction states of the transfer transistors TF0, TF2, TF4, and TF6. For example, to the control lines BLS, in a data erasing operation, a reference potential, for example, a ground voltage Vss is given.

In the second hookup region 13-2, the second transfer control circuit 22-2 is arranged. The second transfer control circuit 22-2 comprises the plurality of control lines BLS, which are connected to the gates of the transfer transistors TF1, TF3, TF5, and TF7, respectively.

The second transfer control circuit 22-2 controls voltages given to the control lines BLS connected to the gates of the transfer transistors TF1, TF3, TF5, and TF7 to control the conduction states of the transfer transistors TF1, TF3, TF5, and TF7. For example, to the control lines BLS, in a data erasing operation, a ground voltage Vss is given.

A layout of a bit-line hookup circuit and a sectional structure thereof will be described below with reference to FIGS. 5 to 11.

Figure 8:
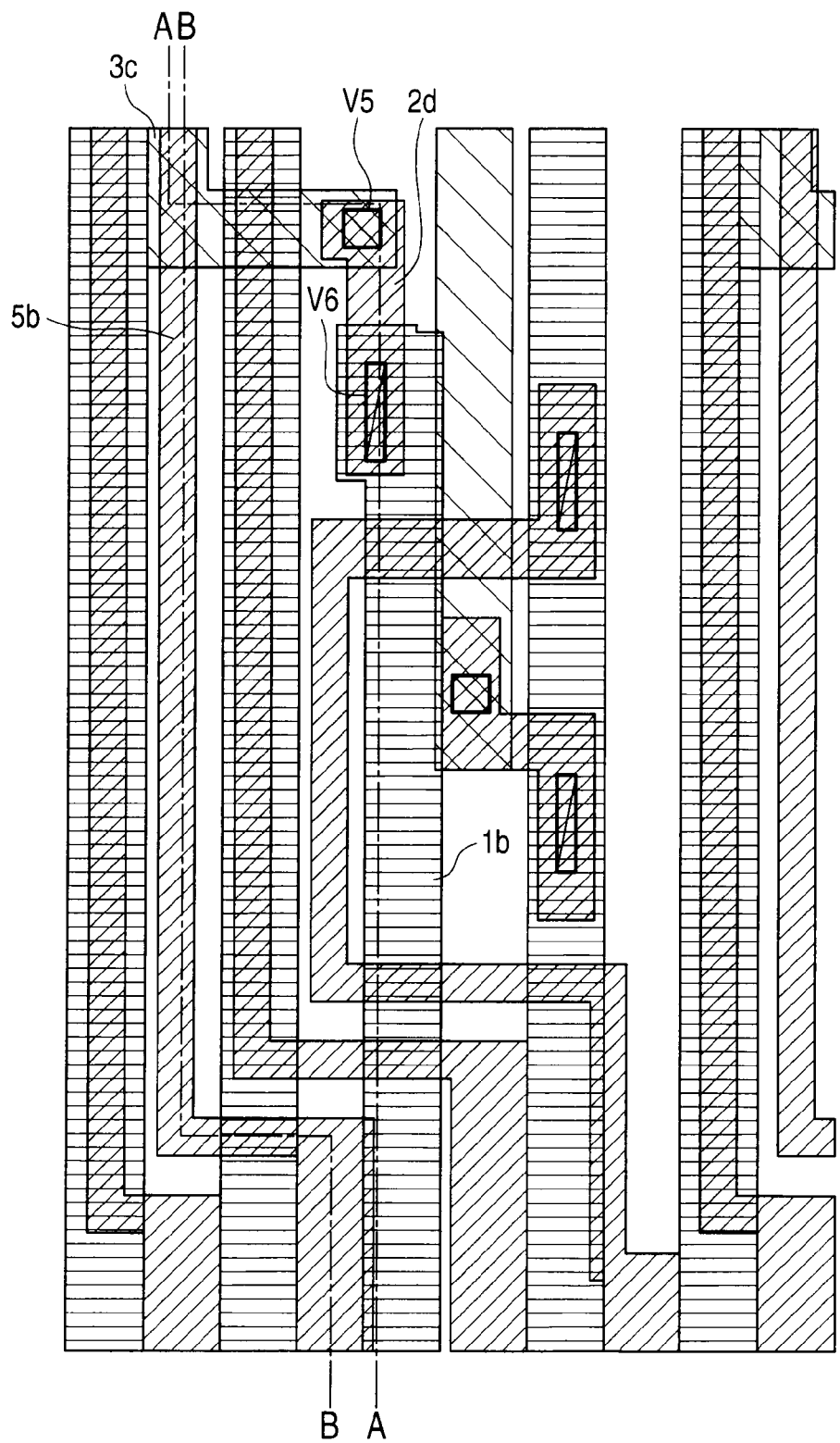
Figure 9:
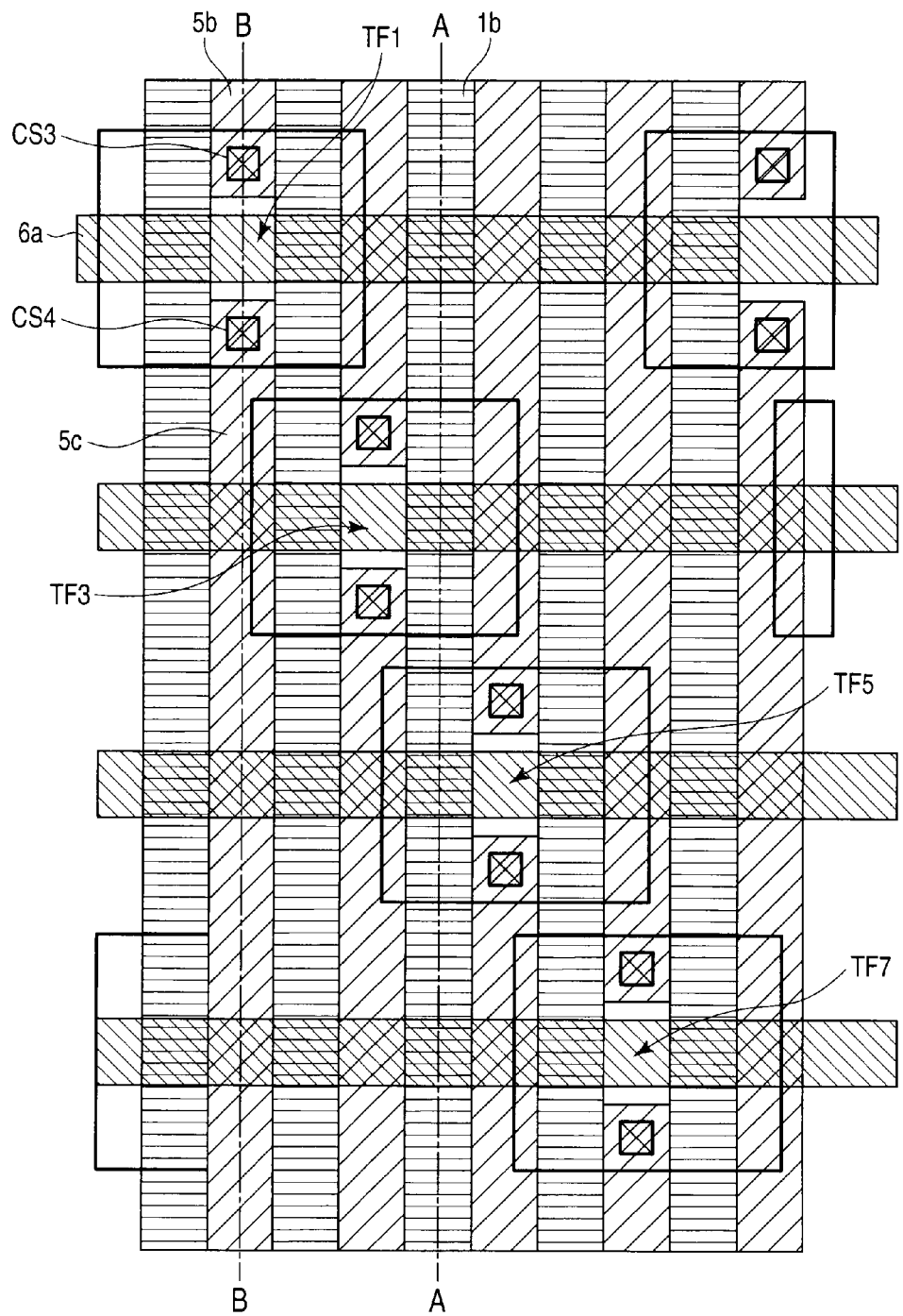
Figure 10:
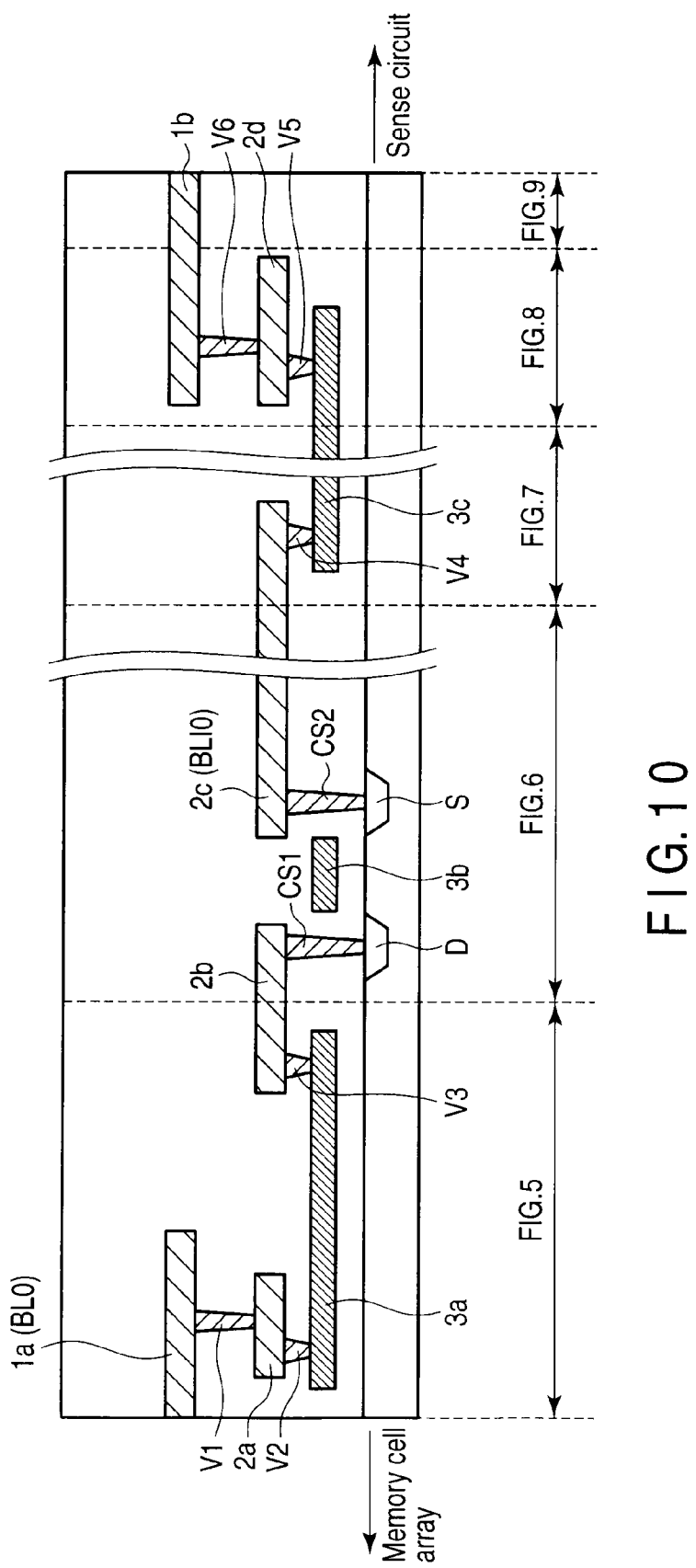
FIGS. 10 and 11 are a sectional view of a hookup region in the semiconductor integrated circuit according to the first embodiment.
Figure 11:
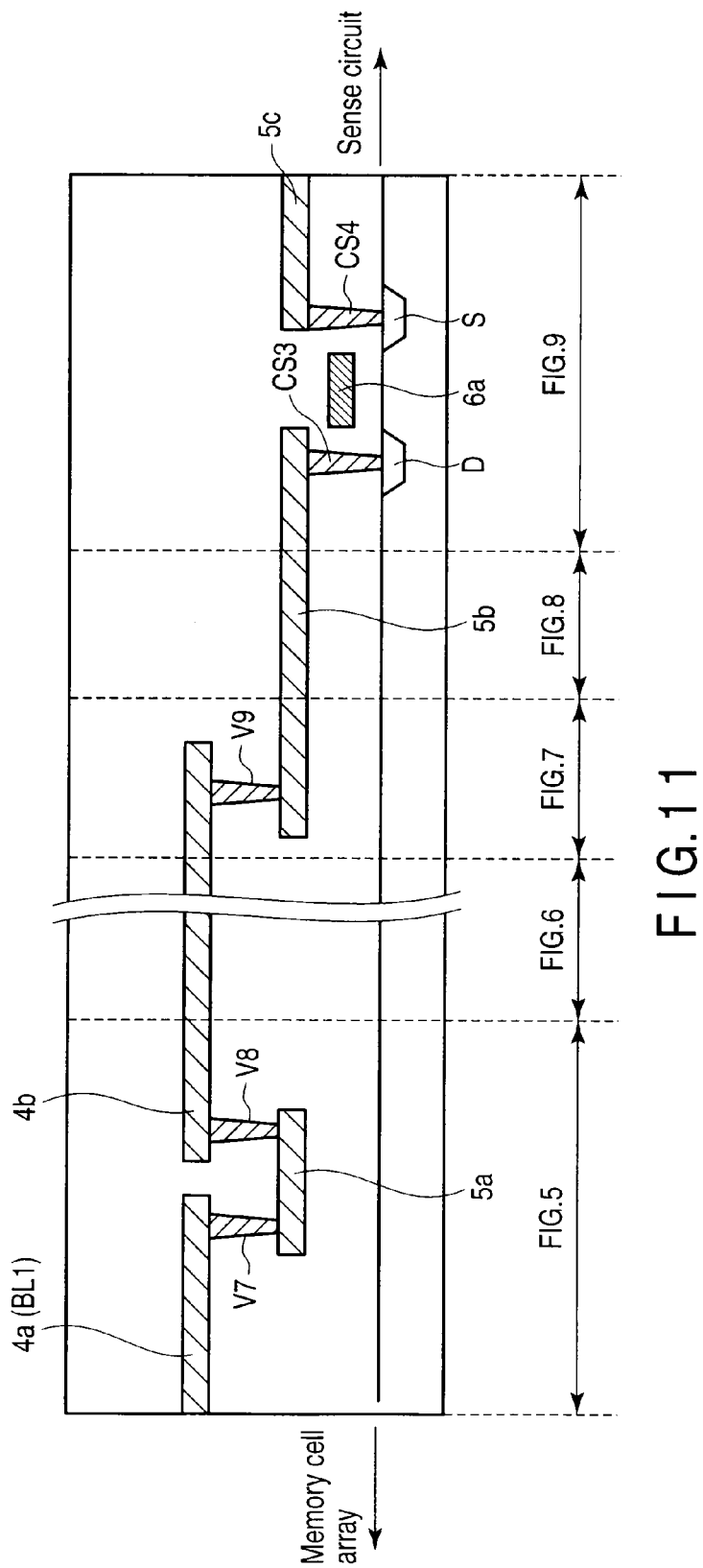

FIGS. 5 to 9 are layout diagrams of a hookup region in the first embodiment, and FIGS. 10 and 11 are sectional views of the hookup region.

A layout of the bit line BL0 and a sectional structure in the interconnection direction (line A-A) will be described first with reference to FIGS. 5 to 9 and 10. A GC interconnection layer is an interconnection formed by the same interconnection layer as that of the gate electrode (control line BLS) of the transfer transistor. The M0 interconnection layer is a first interconnection layer formed on the GC interconnection layer through an interlayer insulating film. The M1 interconnection layer is a second interconnection layer formed on the M0 interconnection layer through an interlayer insulating film. Since the GC interconnection layer is formed by using the interconnection layer of the gate electrode of the transfer transistor, a new interconnection layer need not be formed as the GC interconnection layer.

Figure 5:
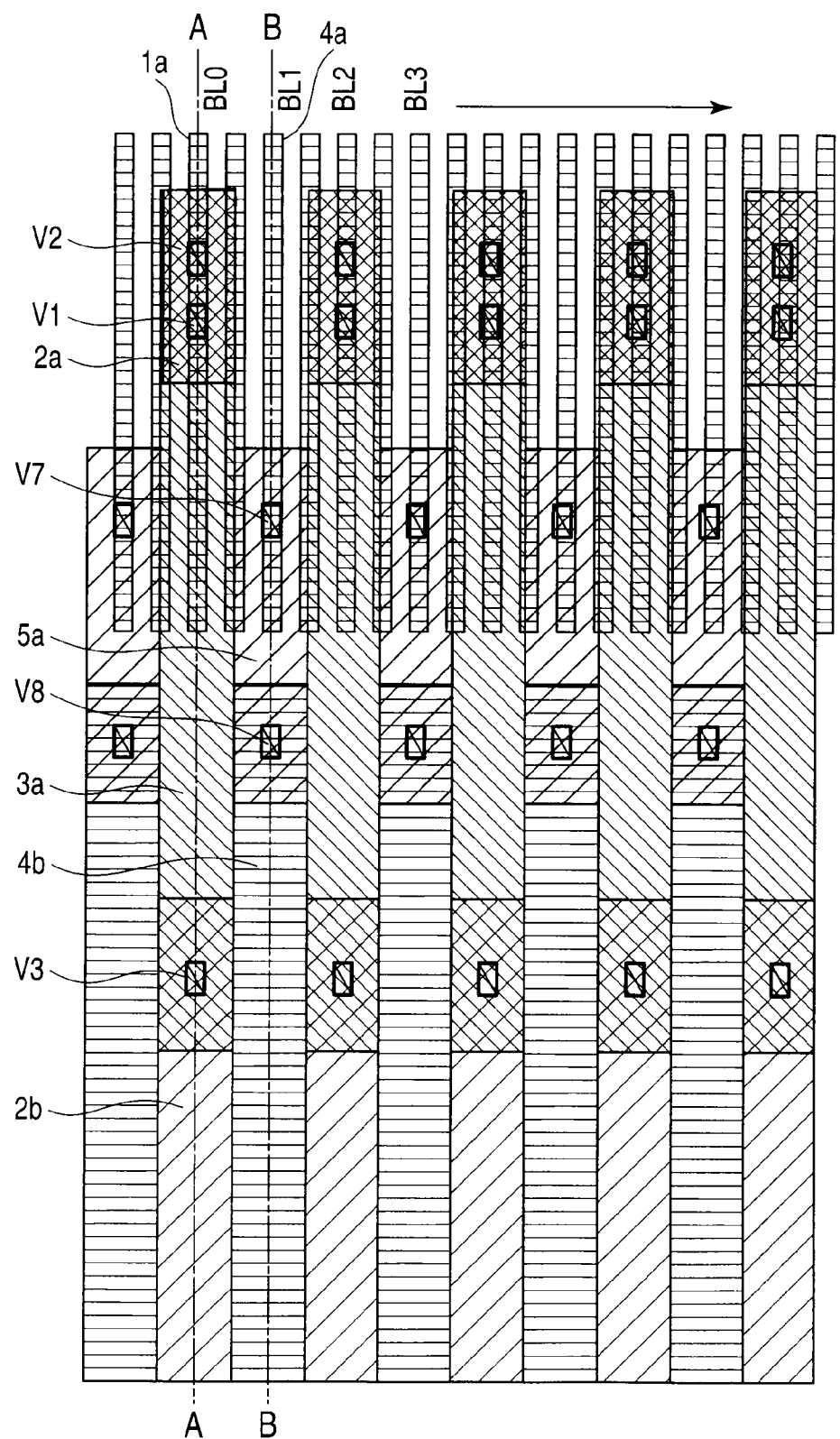
FIGS. 5 to 9 are a layout diagram of a hookup region in the semiconductor integrated circuit according to the first embodiment.

As shown in FIG. 10, an M1 interconnection layer 1a serving as the bit line BL0 is connected to an M0 interconnection layer 2a by a contact plug V1. The M0 interconnection layer 2a is connected to a GC interconnection layer 3a by a contact plug V2. Furthermore, the GC interconnection layer 3a is connected to an M0 interconnection layer 2b by a contact plug V3. A layout corresponding to the sectional structure up to now is shown in FIG. 5. Although the GC interconnection layer is a gate electrode layer, the GC interconnection layer is used as an interconnection here.

Figure 6:
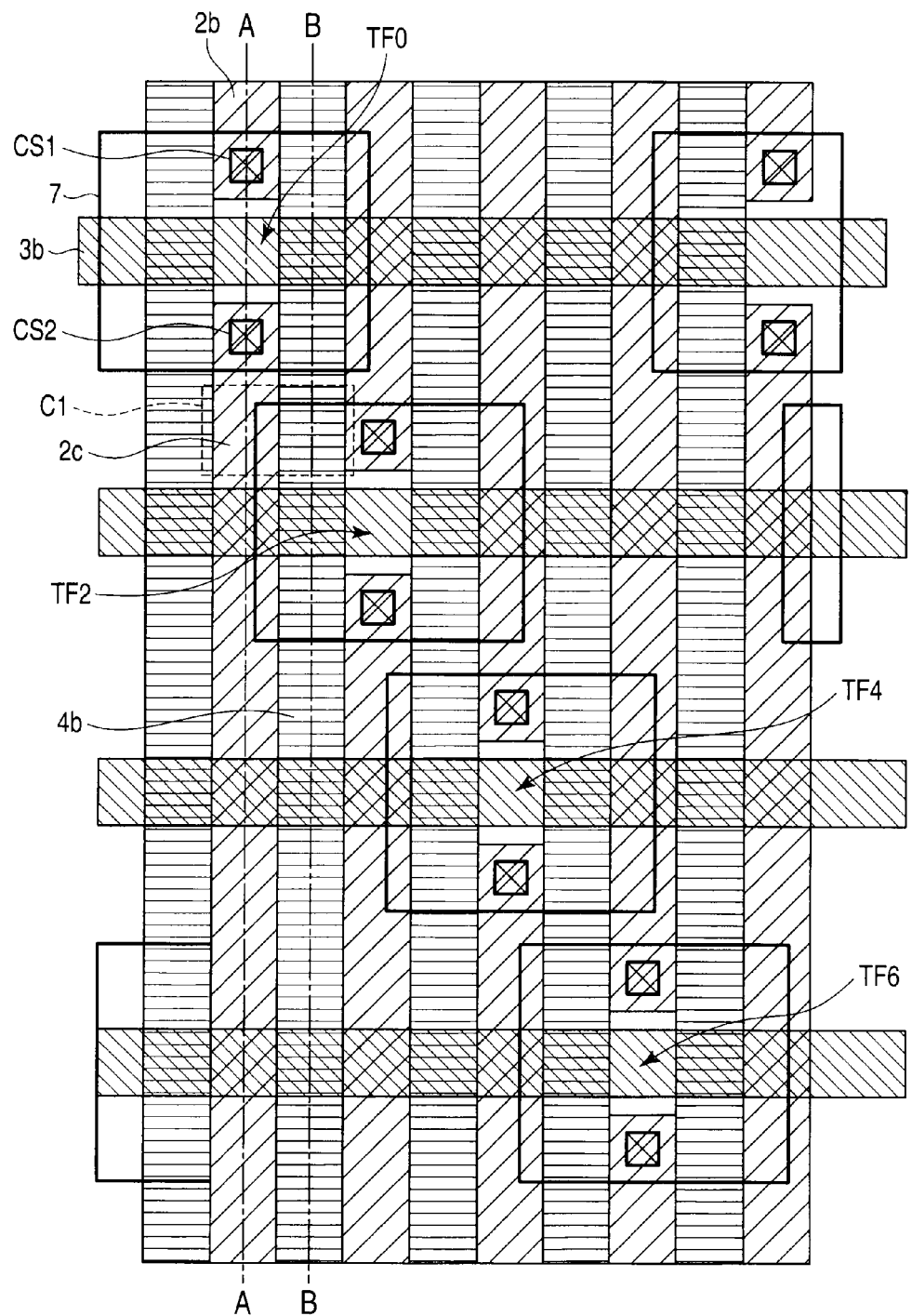

The M0 interconnection layer 2b is connected to a drain D of the transfer transistor TF0 in the first hookup region 13-1 by a contact plug CS1. A source S of the transfer transistor TF0 is connected to an M0 interconnection layer 2c serving as the internal bit line BLI0 by a contact plug CS2. A GC interconnection layer 3b is a gate electrode of the transfer transistor TF0. A layout corresponding to the sectional structure up to now is shown in FIG. 6.

Figure 7:
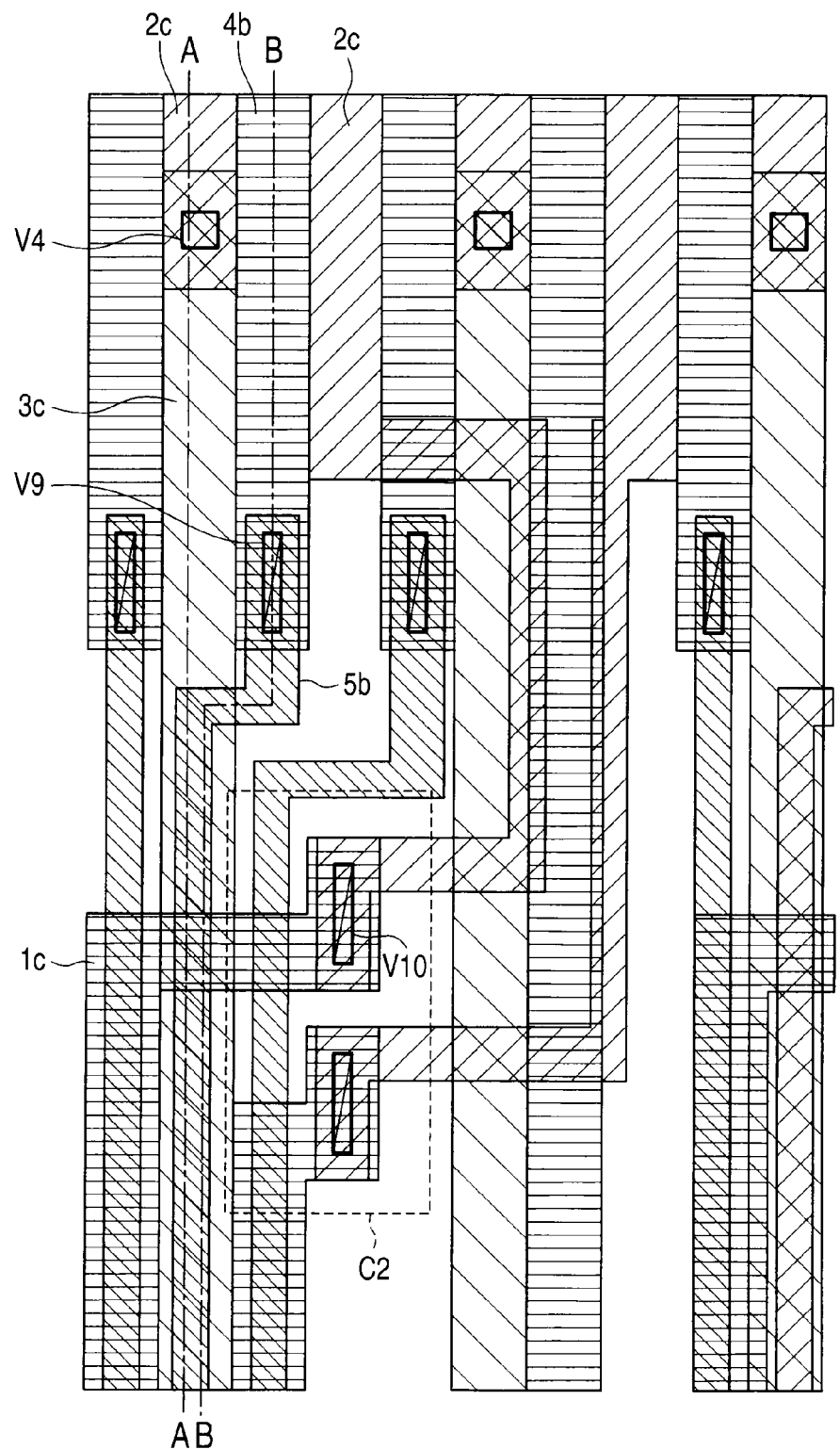

The M0 interconnection layer 2c is connected to a GC interconnection layer 3c by a contact plug V4. A layout corresponding to the sectional structure up to now is shown in FIG. 7.

The GC interconnection layer 3c is connected to an M0 interconnection layer 2d by a contact plug V5. The M0 interconnection layer 2d is connected to an M1 interconnection layer 1b by a contact plug V6. A layout corresponding to the sectional structure up to now is shown in FIGS. 8 and 9. Furthermore, the M1 interconnection layer 1b is connected to the sense circuit 12-1.

A layout of the bit line BL1 and a sectional structure in the interconnection direction (line B-B) will be described with reference to FIGS. 5 to 9 and 11.

As shown in FIG. 11, an M1 interconnection layer 4a serving as the bit line BL1 is connected to an M0 interconnection layer 5a by a contact plug V7. The M0 interconnection layer 5a is returned to and connected to an M1 interconnection layer 4b by a contact plug V8. A layout corresponding to the sectional structure up to now is shown in FIGS. 5 and 6.

The M1 interconnection layer 4b is connected to an M0 interconnection layer 5b by a contact plug V9. A layout corresponding to the sectional structure up to now is shown in FIGS. 7 and 8.

The M0 interconnection layer 5b is connected to a drain D of the transfer transistor TF1 in the second hookup region 13-2 by a contact plug CS3. The source S of the transfer transistor TF1 is connected to an M0 interconnection layer 5c by a contact plug CS4. A GC interconnection layer 6a is a gate electrode of the transfer transistor TF1. A layout corresponding to the sectional structure up to now is shown in FIG. 9. Furthermore, the M0 interconnection layer 5c is connected to the sense circuit 12-1.

As described above, since the sense circuits 12-1 and 12-2 are arranged at both ends of the memory cell array 11, the bit lines are alternately drawn to the sense circuits 12-1 and 12-2 on both the ends.

As shown in FIG. 5, the contact plug V1 is used to connect the M1 interconnection layer 1a to the lower M0 interconnection layer 2a, and the contact plug V7 is used to connect the M1 interconnection layer 4a to the lower M0 interconnection layer 5a.

Furthermore, the M0 interconnection layer 2a is connected to the GC interconnection layer 3a by the contact plug V2. Since the length of the M0 interconnection layer 2a in the longitudinal direction is determined by a region required to contact the contact plugs V1 and V2, the M0 interconnection layer 2a does not need to be much long and thus has an island shape. A space in which a physical short-circuit is not formed from the M0 interconnection layer 2a is secured to arrange the M0 interconnection layer 5a.

The contact plug V7 which connects the M1 interconnection layer (bit line BL1) 4a to the M0 interconnection layer 5a is arranged at a position "4F" apart from the contact plug V1. A reference symbol "F" denotes half of a pitch at which lines and spaces are aligned and a minimum processing dimension. In this case, reference symbol "F" denotes half of a pitch at which bit lines are aligned.

In this manner, pitches of the M0 interconnection layers, the contact plugs, and the GC interconnection layers drawn from the bit lines BL aligned at a "2F" pitch can be moderated to "8F" pitch.

Since the bit line BL is formed in the cell array 11 which uses the minimum processing dimension in the chip of the NAND flash memory, difficulties in photolithography and processing are high. Except for the memory cell array, a layout in which an interconnection pitch, interconnection dimensions, diameters of the contact plugs, and a pitch of the contact plugs are moderated is preferable. The severe layout easily causes short-circuiting of the interconnections and unopening of openings or contact holes, and the risk of reducing a yield may be posed. In the embodiment, the difficulties of photolithography and processing are reduced to make it possible to suppress a yield from decreasing.

As shown in FIG. 6, the M1 interconnection layer 4b to which a potential of the bit line BL is applied is a passing interconnection in the region shown in FIG. 6. The transfer transistor TF0 configured by an n-channel MOS field effect transistor is configured in such a manner that the GC interconnection layer 3b serving as a gate electrode passes through an active region 7.

The M0 interconnection layer 2b to which a potential of the bit line BL0 is applied is connected to the drain D of the transfer transistor TF0 by the contact plug CS1. The source S of the transfer transistor TF0 is connected to the M0 interconnection layer 2c by the contact plug CS2. The bit line BL0 passes through the transfer transistor TF0 and is connected to the internal bit line BLI0.

In an erasing operation of the NAND flash memory, although the bit line BL is boosted to about 25 V, the bit line BL and the internal bit line BLI are electrically separated from each other because the transfer transistor is turned off. A potential of the internal bit line BLI is about a power supply voltage Vdd (for example, about 3 V).

In a region C1, conventionally, a region in which the M0 interconnection layer of the bit line BL and the M0 interconnection layer of the internal bit line BLI face each other. In this case, in an erasing operation, a potential difference between the M0 interconnection layer of the bit line BL and the M0 interconnection layer of the internal bit line BLI is 25 V−3 V=22 V, and a problem in reliability such as short-circuiting and disconnection may be posed.

In order to prevent this, a distance between interconnections to which a high voltage difference is applied is advantageously increased. Therefore, in the embodiment, the bit lines aligned at the "4F" pitch by drawing the alternate bit lines are further allocated to the M0 interconnection layer 2c and the M1 interconnection layer 4b, as shown in FIG. 6, to obtain an "8F" pitch, thereby securing a distance between the M0 interconnection layers between which a high voltage difference is generated. This is very advantageous when a memory cell array is so miniaturized that a distance between interconnections of bit lines or the like cannot be secured.

In FIG. 7, all the M0 interconnection layers 2c are converted into the internal bit lines BLI. The M0 interconnection layers 2c, the number of which is half the number of bit lines, are connected to the GC interconnection layer 3c by the contact plug V4.

In FIG. 5, a bit line connected to the M1 interconnection layer 4b, as shown in FIG. 7, is connected to the M0 interconnection layer 5b by the contact plug V9. The M0 interconnection layers 2c of the remaining bit lines, for example, the bit lines BL2 are connected to an M1 interconnection layer 1c by a contact plug V10. In this region, the internal bit line BLI is raised from the M0 interconnection layer 2c to the M1 interconnection layer 1c, and the bit line BL is lowered from the M1 interconnection layer 4b to the M0 interconnection layer 5b.

The GC interconnection layer 3c is used to reduce appearance of the M0 interconnection layer in the region. For this reason, as shown in a region C2, a distance which moderates a high voltage difference between the bit line BL and the internal bit line BLI can be secured.

FIG. 8 is a layout diagram in which one end of a layout is in contact with the region in FIG. 7 and the other end is in contact with a transistor alignment region which is the same as that in FIG. 6 and is shown in FIG. 9. The GC interconnection layer 3c of the bit line BLI is connected to the M1 interconnection layer 1b through the contact plug V5, the M0 interconnection layer 2d, and the contact plug V6 while bypassing the M0 interconnection layer 5b of the bit line BL.

In this region, in FIG. 7, the internal bit line BLI connected to the GC interconnection layer is raised to the M1 interconnection layer, and a layout is formed in consideration of a distance between the M0 interconnection layer of the bit line BL and the M0 interconnection layer of the internal bit line BLI.

The M0 interconnection layer 5b of the bit line BL is connected to the layout in FIG. 9 which is the same as that in FIG. 6, and is converted into the M0 interconnection layer 5c of the internal bit line BLI through the transfer transistor. Furthermore, the M0 interconnection layer 5c is connected to the low-voltage drive sense circuit 12-1.

As described above, a high voltage difference is generated between the bit line BL and the internal bit line BLI in an erasing operation. When a voltage relation cannot be moderated, a distance between the bit line BL and the internal bit line BLI must be increased. However, it is difficult to secure an appropriate distance due to miniaturization. In particular, a distance between the interconnections on the M0 interconnection layer is hard to secure. Therefore, in the embodiment, a frequency of appearance of an M0 interconnection layer as in the layouts shown in FIGS. 5 to 9 is reduced to make it possible to secure a distance between the M0 interconnection layers between which a high voltage difference is generated.

[1-4] Data Erasing Operation

An erasing operation in the NAND flash memory according to the first embodiment will be described below with reference to FIG. 12.

FIG. 12 is a timing chart of a bit-line hookup circuit in an erasing operation in the NAND flash memory according to the first embodiment.

As shown in FIG. 12, since the erasing operation is started first, a well potential CPWELL of the memory cell array 11 is boosted from the ground voltage Vss to an erasing voltage Vera (for example, about 25 V).

In this case, the bit lines BL0 to BLn are electrically charged from about an erasing voltage to a level of the Vera to follow the well potential CPWELL. On the other hand, the internal bit lines BLI0 to BLIn on the sense circuit 12 side are electrically separated from the bit lines BL0 to BLn on the memory cell array 11 side because the control lines BLS are at the ground voltage Vss. For this reason, the voltages of the internal bit lines BLI0 to BLIn are kept at the power supply voltage Vdd (for example, 3 V).

Therefore, a potential difference of about 22 V is generated between the bit lines BL0 to BLn on the memory cell array 11 side and the bit lines BL0 to BLn on the sense circuit 12 side.

[1-5] Advantage

According to the embodiment, the plurality of bit lines are alternately drawn to both the ends of the memory cell array, whereby the interconnection layers from the bit lines to the sense circuit are formed by using the three interconnection layers (M1 interconnection layer, M0 interconnection layer, and GC interconnection layer) while securing margins for photolithography in formation of the bit lines (especially, the M0 interconnection layer) to moderate a withstand voltage between the interconnections. In this manner, the frequency of appearance of the M0 interconnection layers is reduced, and a distance between a high-voltage bit-line node and a low-voltage internal bit-line node passing through a transfer transistor which face each other, i.e., a distance between a bit-line node and an internal bit-line node can be increased to satisfy a specification of a withstand voltage.

In addition to the M0 interconnection layer and the M1 interconnection layer, by using a GC interconnection layer configured by the same layer as the gate electrode layer and made of the same material as that of the gate electrode layer, the bit lines on the bit-line hookup circuit can be formed by three interconnection layers without increasing the number of steps.

The sense circuits are arranged at both the ends of the memory cell array, an even-numbered bit line is connected to the sense circuit at one end, and an odd-numbered bit line is connected to the sense circuit at the other end, so that a pitch between the bit lines arranged in the bit-line hookup region can be moderated.

An alignment pitch of the bit lines in the bit-line hookup region is constantly kept at "4F", and an alignment periodicity of a pattern is kept, so that margins for photolithography and processing can be increased.

In the embodiment, the bit lines aligned in the planar direction of a semiconductor substrate are distributed in the layer direction to realize an interconnection layout in which high-potential and low-potential interconnections do not face each other with minimum spaces. It is possible to realize a semiconductor memory device which prevents a problem of short-circuiting and disconnection of interconnections without breaking the alignment periodicity of the interconnections or reducing margins for photolithography and which satisfies an increase in capacity and high reliability of a storage element.

As described above, according to the embodiment, there is provided a semiconductor integrated circuit which can assure a withstand voltage between the interconnections on the bit-line hookup circuit and can secure margins for photolithography.

[2] Second Embodiment

A NAND flash memory according to a second embodiment of the present invention will be described. In the second embodiment, transfer transistors are arranged on parts of bit lines in a bit-line hookup circuit in series. In the second embodiment, descriptions of repetitive parts such as the entire configuration and the block configuration of the first embodiment will be omitted.

[2-1] Configuration of Bit-Line Hookup Circuit

The bit-line hookup circuit 13 arranged between the memory cell array 11 and the sense circuit 12-1 will be described below with reference to FIGS. 13 and 14.

Figure 13:
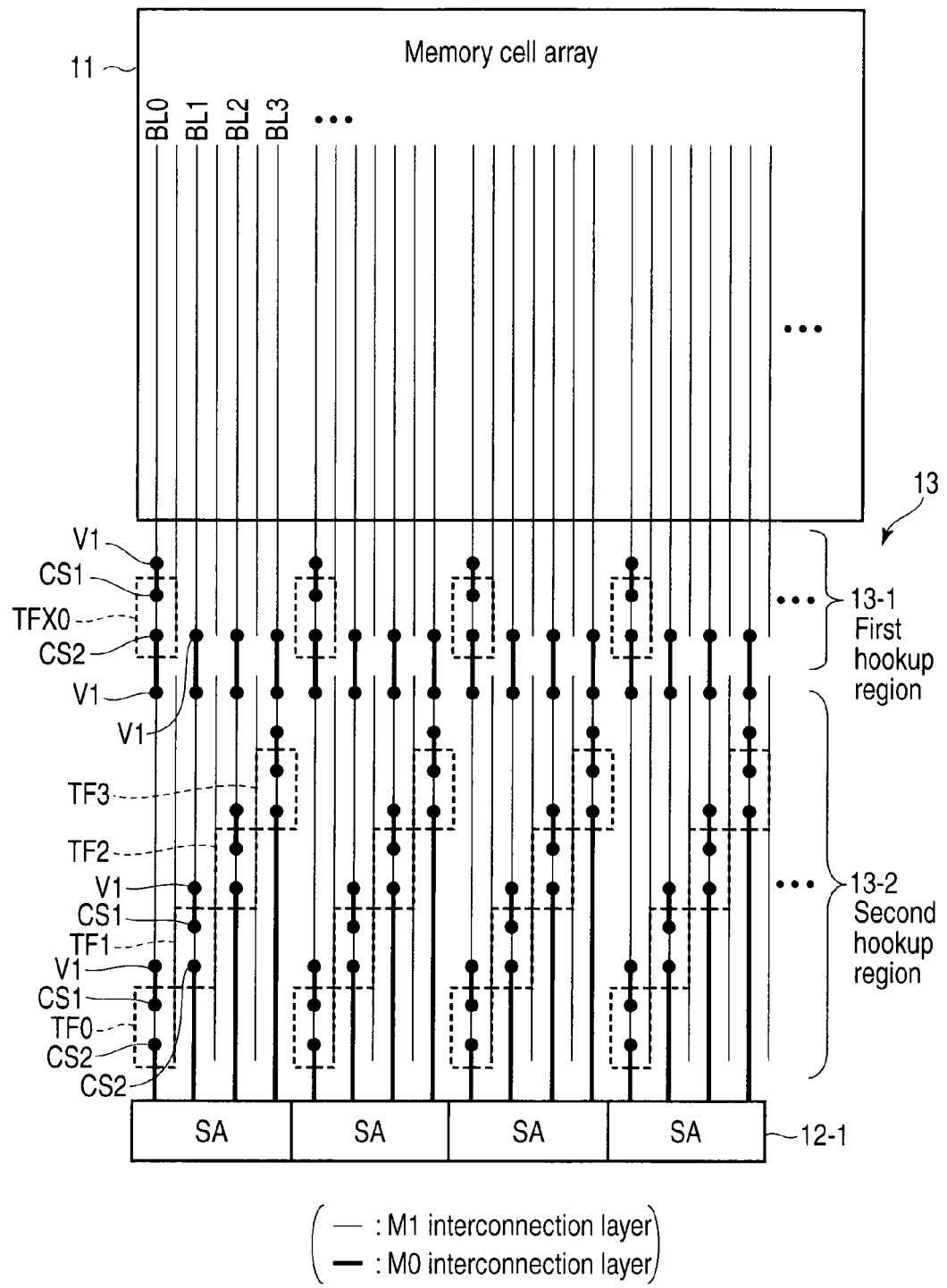
FIG. 13 is a schematic diagram showing a layout of a memory cell array, a sense circuit, and a bit-line hookup circuit in a semiconductor integrated circuit according to a second embodiment.

FIG. 13 is a schematic diagram showing a layout of a memory cell array, a sense circuit, and a bit-line hookup circuit in the NAND flash memory according to the second embodiment. FIG. 14 is a circuit diagram showing a configuration of a bit-line hookup circuit in the second embodiment.

The bit-line hookup circuit 13 is configured by the first hookup region 13-1, the second hookup region 13-2, the first transfer control circuit 22-1, and the second transfer control circuit 22-2. In this case, a layout and a circuit configuration of the bit lines BL0 to BL3 will be described. Since the layout and the circuit configuration subsequent to the bit line BL4 are repetitions of the bit lines BL0 to BL3, a description thereof will be omitted.

The first hookup region 13-1 comprises a transfer transistor TFX0, and the second hookup region 13-2 comprises four transfer transistors TF0 to TF3.

The bit line BL0 of the M1 interconnection layer is connected to the drain of the transfer transistor TFX0 through the contact plug V1, the M0 interconnection layer, and the contact plug CS1. The source of the transfer transistor TFX0 is connected to the M1 interconnection layer through the contact plug CS2, the M0 interconnection layer, and the contact plug V1.

The M1 interconnection layer is connected to the drain of the transfer transistor TF0 through the contact plug V1, the M0 interconnection layer, and the contact plug CS1. The source of the transfer transistor TF0 is connected to the internal bit line BLI0 of the M0 interconnection layer through the contact plug CS2. Furthermore, the internal bit line BLI0 is connected to the sense amplifier SA0 in the sense circuit 12-1.

The bit lines BL1 to BL3 of the M1 interconnection layer are connected to the M1 interconnection layer through the contact plug V1, the M0 interconnection layer, and the contact plug V1. The M1 interconnection layer is connected to the drains of the transfer transistors TF1 to TF3 through the contact plug V1, the M0 interconnection layer, and the contact plug CS1, respectively. The sources of the transfer transistors TF1 to TF3 are connected to the internal bit lines BLI1 to BLI3 of the M0 interconnection layer through the contact plug CS2, respectively. Furthermore, the internal bit lines BLI1 to BLI3 are connected to the sense amplifiers SA1 to SA3 in the sense circuit 12-1, respectively.

The first transfer control circuit 22-1 comprises a control line BLSX, and the control line BLSX is connected to the gate of the transfer transistor TFX0. The first transfer control circuit 22-1 controls a voltage given to the control line BLSX connected to the gate of the transfer transistor TFX0 to control a conduction state of the transfer transistor TFX0. For example, to the control line BLSX, in a data erasing operation, a voltage which is output from a bit-line transfer output line BLX0 at about 10 V which is half a bit-line voltage of about 20 V, i.e., a sum ((from Vera/2)+Vth) of a voltage half the erase voltage Vera and a threshold voltage Vth is given.

The second transfer control circuit 22-2 comprises control lines BLS, and the control lines BLS are connected to the gates of the transfer transistors TF1 to TF3, respectively. The second transfer control circuit 22-2 controls voltages given to the control lines BLS connected to the gates of the transfer transistors TF1 to TF3 to control the conduction states of the transfer transistors TF1 to TF3. For example, to the control lines BLS, in a data erasing operation, a reference voltage, for example, a ground voltage Vss is given.

As described above, in the first and second hookup regions 13-1 and 13-2, the transistor transistors TFX0 and TF0 are connected in series with each other in the bit-line direction. For this reason, the periodicity of the interconnections of the bit lines BL is not broken, and margins for photolithography are not reduced. For this reason, short-circuiting, disconnection, and the like of the interconnections can be advantageously prevented.

The bit lines BL0 to BL3 serving as the M1 interconnection layers arranged in the first and second hookup regions 13-1 and 13-2 are commonly aligned at the same pitch. For this reason, random patterns are reduced in number to make it possible to increase margins for photolithography.

The example has been described in which, in the first hookup region 13-1 according to the embodiment, the transfer transistor TFX0 is arranged on the bit line BL0 comprising a transfer transistor at a position close to the sense circuit 12. This is because, since the M0 interconnection layers of the transistor group of the second hookup region 13-2 which is close to the sense circuit 12-1 are jammed with each other, a distance between interconnections is secured to improve the reliability of a withstand voltage. However, the configuration is not limited to the one described above, and transfer transistors may be further arranged on the bit lines BL1 to BL3 in the first hookup region 13-1.

[2-2] Modification of Bit-Line Hookup Circuit

A modification of the second embodiment will be described below. In this modification, only a configuration of a bit-line hookup circuit is different from that of the second embodiment, and the other configurations are the same as those of the second embodiment.

In the second embodiment, there are a first hookup region and a second hookup region. However, in the modification, the second hookup region is divided into two regions to obtain three hookup regions.

FIG. 15 is a schematic diagram showing a layout of a memory cell array, a sense circuit, and a bit-line hookup circuit in the NAND flash memory according to the modification of the second embodiment. FIG. 16 is a circuit diagram showing a configuration of a bit-line hookup circuit in the modification of the second embodiment.

The bit-line hookup circuit 13 is configured by the first hookup region 13-1, the second hookup region 13-2, the third hookup region 13-3, the first transfer control circuit 22-1, the second transfer control circuit 22-2 and a third transfer circuit 22-3. In this case, a layout and a circuit configuration of the bit lines BL0 to BL3 will be described. The layout and the circuit configuration subsequent to the bit line BL4 are repetitions of the bit lines BL0 to BL3.

The first hookup region 13-1 comprises a transfer transistor TFX0, the second hookup region 13-2 comprises two transfer transistors TF0 and TF1, and the third hookup region 13-3 comprises two transfer transistors TF2 and TF3.

The bit line BL0 of the M1 interconnection layer is connected to the drain of the transfer transistor TFX0 through the contact plug V1, the M0 interconnection layer, and the contact plug CS1. The source of the transfer transistor TFX0 is connected to the M1 interconnection layer through the contact plug CS2, the M0 interconnection layer, and the contact plug V1.

The M1 interconnection layer is connected to the drain of the transfer transistor TF0 through the contact plug V1, the M0 interconnection layer, and the contact plug CS1. The source of the transfer transistor TF0 is connected to the M1 interconnection layer through the contact plug CS2, the M0 interconnection layer, and the contact plug V1.

The M1 interconnection layer is also connected to the M1 interconnection layer through the contact plug V1, the M0 interconnection layer, and the contact plug V1, and the M1 interconnection layer is connected to the internal bit line BLI0 of the M0 interconnection layer through the contact plug V1. Furthermore, the internal bit line BLI0 is connected to the sense amplifier SA0 in the sense circuit 12-1.

The bit line BL1 of the M1 interconnection layer is connected to the M1 interconnection layer through the contact plug V1, the M0 interconnection layer, and the contact plug V1. The M1 interconnection layer is connected to the drain of the transfer transistor TF1 through the contact plug V1, the M0 interconnection layer, and the contact plug CS1. The source of the transfer transistor TF1 is connected to the M1 interconnection layer through the contact plug CS2, the M0 interconnection layer, and the contact plug V1.

The M1 interconnection layer is also connected to the M1 interconnection layer through the contact plug V1, the M0 interconnection layer, and the contact plug V1, and the M1 interconnection layer is connected to the internal bit line BLI1 of the M0 interconnection layer through the contact plug V1. Furthermore, the internal bit line BLI1 is connected to the sense amplifier SA1 in the sense circuit 12-1.

The bit lines BL2 and BL3 of the M1 interconnection layer are connected to the M1 interconnection layer through the contact plug V1, the M0 interconnection layer, and the contact plug V1. The M1 interconnection layer is connected to the M1 interconnection layer through the contact plug V1, the M0 interconnection layer, and the contact plug V1. The M1 interconnection layer is connected to the drains of the transfer transistors TF2 and TF3 through the contact plug V1, the M0 interconnection layer, and the contact plug CS1, respectively. The sources of the transfer transistors TF2 and TF3 are connected to the internal bit lines BLI2 and BLI3 of the M0 interconnection layer through the contact plug CS2, respectively. Furthermore, the internal bit lines BLI2 and BLI3 are connected to the sense amplifiers SA2 and SA3 in the sense circuit 12-1, respectively.

[2-3] Data Erasing Operation

The erasing operations in the second embodiment and the modification thereof are as follows.

In order to start the erasing operation, the well potential CPWELL of the memory cell array 11 rises from the ground voltage Vss to erasing voltage Vera (about 25 V).

In this case, the bit lines BL0 to BL3 are electrically charged from about an erasing voltage to a level of the Vera to follow a well potential CPWLL. On the other hand, the internal bit lines BLI0 to BLI3 on the sense circuit 12-1 side are electrically separated from the bit lines BL0 to BL3 on the memory cell array 11 side because the control lines BLS are at the ground voltage Vss.

At this time, about a sum ((Vera/2)+Vth) of a voltage half the erase voltage Vera and a threshold voltage Vth is applied to the control line BLSX. For this reason, the interconnection BLX0 serving as a transfer node of the second and third hookup regions 13-2 and 13-3 is connected to the bit-line interconnection BL0 and electrically charged to a voltage level which is almost half (to Vera/2) the erasing voltage Vera.

However, subsequently, when the voltages of the bit lines BL0 to BL3 exceed a voltage level which is about a sum ((Vera/2)+Vth) of a voltage which is half the erase voltage Vera and the threshold voltage Vth, the transfer transistor TFX0 is cut off. For this reason, the electric charge of the interconnection BLX0 is ended at a voltage level which is almost half (to Vera/2) the erasing voltage Vera.

In this manner, when the control line BLSX is controlled by a voltage which is almost the sum ((Vera/2)+Vth) of a voltage half the erase voltage Vera and the threshold voltage Vth, the transfer output line BLX0 can be set at a voltage level which is almost half (to Vera/2) the erasing voltage Vera. In this manner, a potential difference between the bit lines BLI which are adjacent to each other in the word-line direction can be reduced, and a withstand voltage can be moderated.

[2-4] Effect

In the second embodiment and the modification, a transfer transistor which drops a bit-line voltage is arranged on the bit-line hookup circuit, and an intermediate-potential node is arranged, so that a layout in which a high-potential node and a low-potential node do not face each other with a minimum processing dimension can be formed between interconnections. Furthermore, the periodicity of interconnection layouts is kept to make it possible to secure margins for photolithography.

In other words, a transfer transistor which outputs a transfer output at an intermediate potential is connected in series with some of the bit lines in the bit-line hookup region, so that an interconnection layout in which a high-potential bit line and a low-potential bit line do not face each other with the minimum processing dimension. Furthermore, when the transfer transistor is arranged in series, short-circuiting and disconnection of the interconnections can be prevented from occurring without breaking the alignment periodicity of the interconnections. In this manner, a semiconductor memory device which satisfies an increase in capacity and high reliability of a storage element can be realized.

As described above, according to the embodiment, there is a semiconductor integrated circuit which can assure a withstand voltage between the interconnections on the bit-line hookup circuit and can secure margins for photolithography.

Comparative Example

A NAND flash memory according to a comparative example will be described below with reference to FIGS. 17 to 20 to compare with the NAND flash memory according to the embodiment. In this explanation, a detailed explanation of overlapping parts between the comparative example and the embodiment will be omitted.

<Equivalent Circuit Configuration>

As shown in FIG. 17, sense circuits 112-1 and 112-2 and bit-line hookup regions 110-1 and 110-2 are arranged above and under a cell array 111. In this manner, the configuration according to the comparative example is an example in which upper and lower hookup regions are connected to alternate bit lines.

Figure 18:
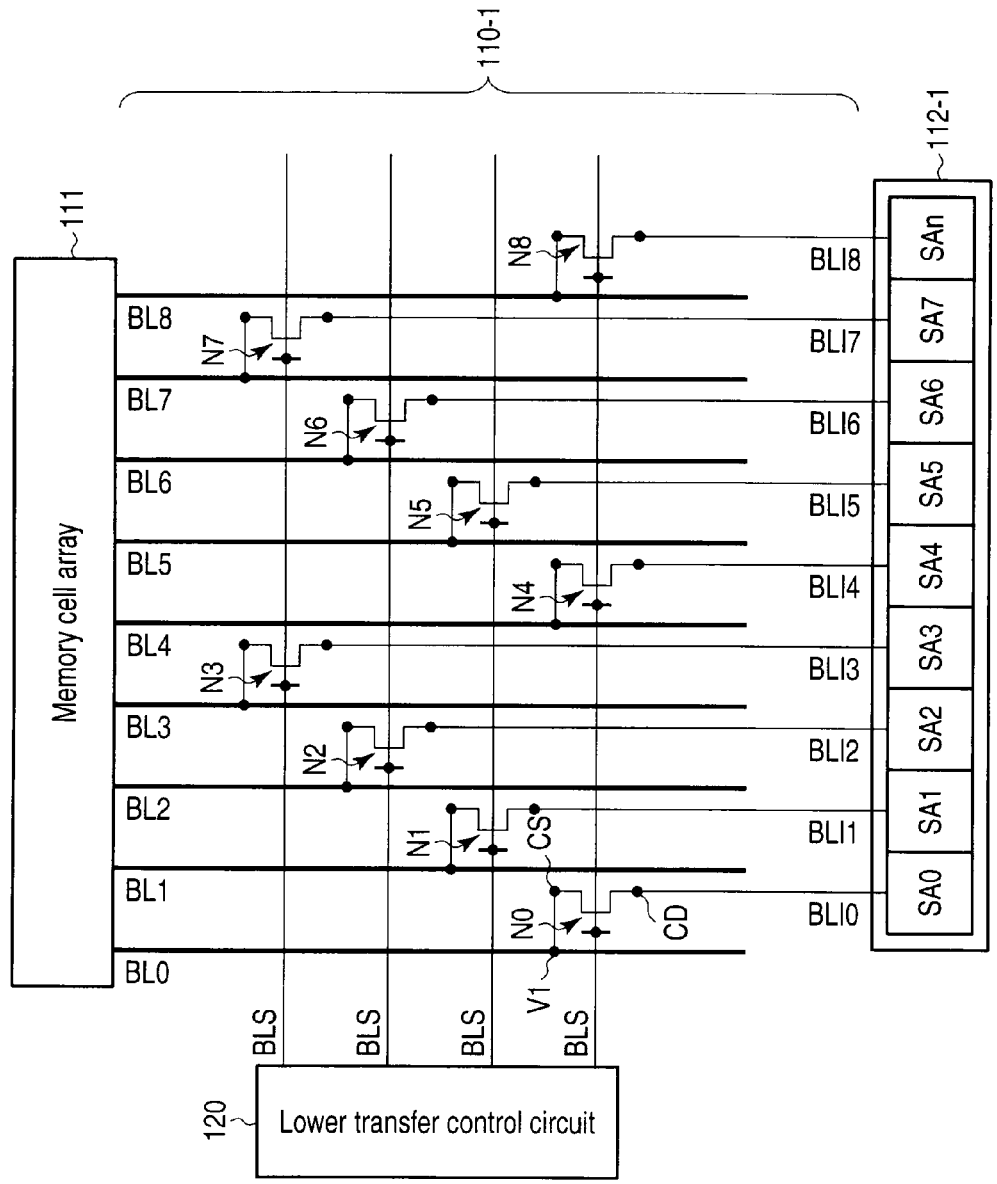
FIG. 18 is a circuit diagram of a hookup region in the semiconductor integrated circuit of the comparative example.

As shown in FIG. 18, bit lines BL0 to BL8, for example, are formed by metal interconnections. The interconnection layer is temporarily called an M1 interconnection layer as in the above description. The contact plug V1 connects the M1 interconnection layer and the lower M0 interconnection layer to each other.

The lower hookup region 110-1 is a region in which a bit line serving as the M1 interconnection layer is connected to the lower M0 interconnection layer. A source contact CS connects the M0 interconnection layer of the bit line to a source diffusion layer. A drain contact CD connects a diffusion layer on a drain side to the M0 interconnection layer.

In the lower hookup region 110-1, transfer transistors N0, N1, . . . , N7 which control switching of the bit lines and the sense circuit 112-1 are present.

<Planar Layout Configuration>

A planar layout configuration according to the comparative example will be described below with reference to FIGS. 19 and 20.

As shown in FIG. 19, lines and spaces are arranged at equal intervals on the M1 interconnection layer. If this unit is expressed as "F" (F denotes a minimum processing dimension), a pitch is expressed as 2F. In this case, a transistor group or the like is not illustrated.

Since, on the M0 interconnection layer, bit lines are drawn upward and downward, a distance between bit lines adjacent to each other in the word-line direction is given by "4F". The contact plugs V1 are desirably formed with a width "1F" in consideration of misalignment between the contact plugs and adjacent bit lines. A dummy interconnection DM0 serving as the M0 interconnection layer is arranged to keep the periodicity of the M0 interconnection layers. However, the layout is determined by a simulation or an experiment.

Figure 20:
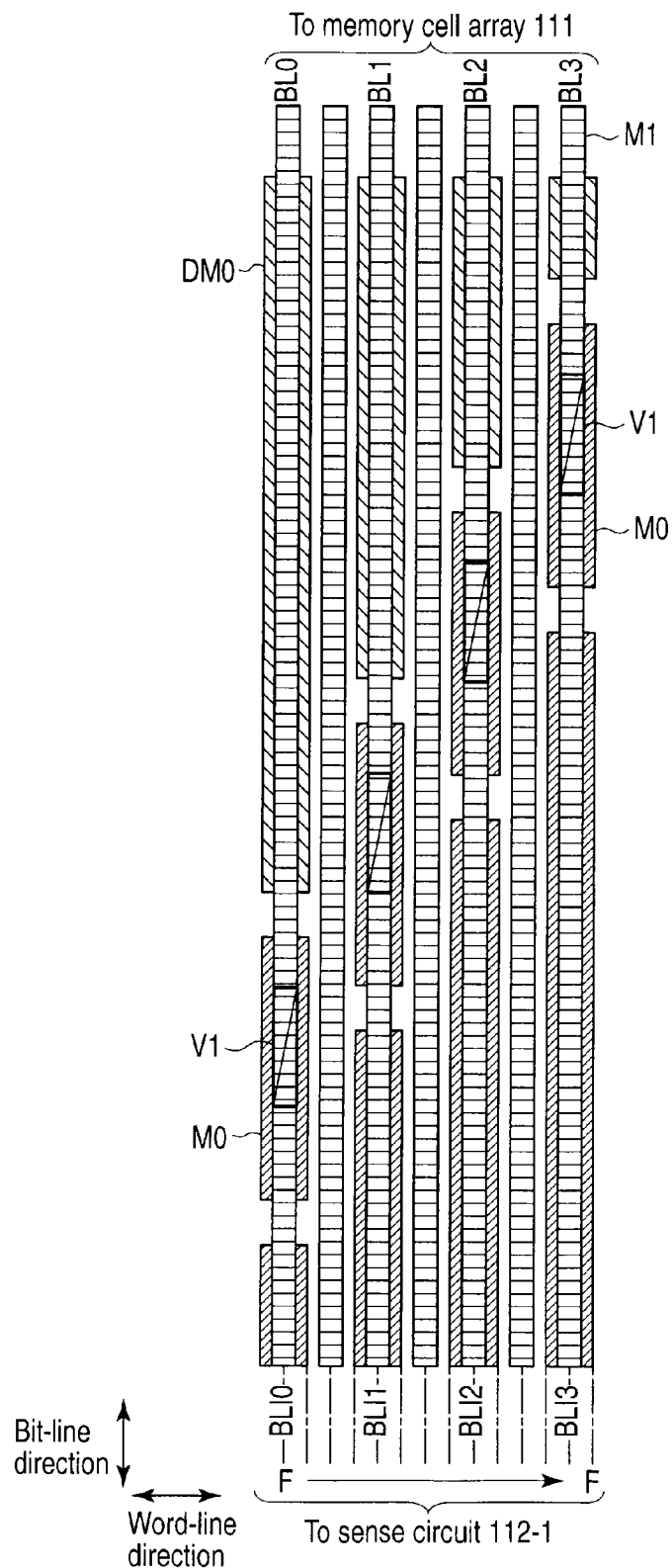

In FIG. 20, the M1 interconnection layer is omitted, and as indicated by a broken line, transfer transistor groups of a first layer to a fourth layer are arranged. In this example, 4 bit lines are defined as a repetitive unit. In this configuration, the transfer transistor group (N3, N7) of the fourth layer is closest to the memory cell array 111, and the transfer transistor group (N0, N4) of the first layer is closest to the sense circuit 112.

In this layout configuration, when miniaturization by an increase in capacity progresses, "F" of the lines and the spaces of the bit lines serving as the M1 interconnection layer approximates to a limit value. For this reason, even a random pattern of the M0 interconnection layers allowed in the previous generation requires the periodicity of "F" to reduce a pitch and to secure margins for lithography.

Furthermore, in the generation in which miniaturization progresses, a distance between the interconnections is reduced. However, since relations between voltages of the interconnections are the same as those in the previous generation, a leak current between the interconnections caused by a withstand voltage between the interconnections is worsened, and the reliability of a memory chip cannot be assured. For example, in a NAND flash memory, in a data erasing operation of a memory cell, a potential difference between the bit line BLn and the internal bit line BLIn is 20 V or more, and the NAND flash memory cannot satisfy a specification of a power consumption of a memory chip due to a leakage between interconnections, and the reliability cannot be assured.

For example, interconnections between which a potential difference is 20 V or more in an erasing state are, in the transistor group (N0, N4) of the first layer, the M0 interconnection layer of the bit line BL0 and the M0 interconnection layer of the internal bit line BLI1 which are connected to each other by the contact plug V1. In the transistor group (N1, N5, . . . ) of the second layer, the interconnections are the M0 interconnection layer of the bit line BL1 and the M0 interconnection layer of the bit line BLI2 which are connected to each other by the contact plug V1.

On the other hand, in the transistor groups (N2, N6) and (N3, N7) of the third and fourth layers, the M0 interconnection layers of the transistor groups of the first and second layers are not present. For this reason, the M0 interconnections are curved as long as the periodicity of "F" is not broken, so that a distance between the interconnection can be assured.

More specifically, in a layout which secures margins for photolithography, when the M0 interconnection layers approach the sense circuit 112, the M0 interconnections are crowded, and a distance which satisfies a specification of a withstand voltage cannot be secured.

According to the embodiment, there is provided a semiconductor integrated circuit which can assure a withstand voltage between the interconnection layers on the bit-line hookup circuit and can secure margins for photolithography.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a memory cell array comprising a plurality of memory cells arranged at crossing points of a plurality of bit lines and a plurality of word lines in a form of a matrix, the bit lines including first, second, third, and fourth bit lines sequentially arranged adjacent to one another;
a first sense circuit which is arranged on a first end side of the memory cell array, electrically connected to the first and third bit lines, and reads data from the memory cell;
a second sense circuit which is arranged on a second end side of the memory cell array, electrically connected to the second and fourth bit lines, and reads data from the memory cell;
a first hookup region arranged between the memory cell array and the first sense circuit, the first hookup region comprising a first transfer transistor including a first current path, one end of the first current path being connected to the first bit line, the other end of the first current path being electrically connected to the first sense circuit; and
a second hookup region arranged between the first hookup region and the first sense circuit, the second hookup region comprising a second transfer transistor including a second current path, one end of the second current path being connected to the third bit line, the other end of the second current path being electrically connected to the first sense circuit,
wherein the first bit line formed in the first hookup region and the second hookup region includes an electrode interconnection layer configured by the same layers as gate electrode layers of the first and second transfer transistors and made of the same material as that of the gate electrode layers.

2. The semiconductor integrated circuit according to claim 1, wherein the first bit line connected to the other end of the first current path of the first transfer transistor includes a first interconnection layer formed on the electrode interconnection layer, and
the third bit line arranged to face the first interconnection layer includes a second interconnection layer formed on the first interconnection layer.

3. The semiconductor integrated circuit according to claim 1, wherein, when a minimum processing dimension is given by "F", the first bit line and the third bit line are arranged at an interval of 4F.

4. The semiconductor integrated circuit according to claim 1, wherein, of the bit lines, an even-numbered bit line is electrically connected to the first sense circuit, and an odd-numbered bit line is electrically connected to the second sense circuit.

5. The semiconductor integrated circuit according to claim 1, further comprising:
- a first transfer control circuit connected to a gate of the first transfer transistor, the first transfer control circuit controlling a conduction state of the first current path of the first transfer transistor; and
- a second transfer control circuit connected to a gate of the second transfer transistor, the second transfer control circuit controlling a conduction state of the second current path of the second transfer transistor.

6. A semiconductor integrated circuit comprising:
- a memory cell array comprising a plurality of memory cells arranged at crossing points of a plurality of bit lines and a plurality of word lines in a form of a matrix, the bit lines including first, second, third, and fourth bit lines sequentially arranged adjacent to one another;
- a first sense circuit which is arranged on a first end side of the memory cell array, electrically connected to the first and third bit lines, and reads data from the memory cell;
- a second sense circuit which is arranged on a second end side of the memory cell array, electrically connected to the second and fourth bit lines, and reads data from the memory cell;
- a first hookup region arranged between the memory cell array and the first sense circuit, the first hookup region comprising a first transfer transistor including a first current path, one end of the first current path being connected to the first bit line; and
- a second hookup region which is arranged between the first hookup region and the first sense circuit, the second hookup region comprising second and third transfer transistors including second and third current paths, respectively, one end of the second current path being electrically connected to the other end of the first current path, the other end of the second current path being electrically connected to the first sense circuit, one end of the third current path being electrically connected to the third bit line, the other end of the third current path being electrically connected to the first sense circuit wherein the first bit line connected to the other end of the first current path of the first transfer transistor includes a first interconnection layer formed on a gate electrode layer of the first transfer transistor, and the third bit line arranged to face the first interconnection layer includes an interconnection layer configured by the same layer as the first interconnection layer and made of the same material as that of the first interconnection layer.

7. The semiconductor integrated circuit according to claim 6, wherein, when a minimum processing dimension is given by "F", the first bit line and the third bit line are arranged at an interval of 4F.

8. The semiconductor integrated circuit according to claim 6, wherein, of the bit lines, an even-numbered bit line is electrically connected to the first sense circuit, and an odd-numbered bit line is electrically connected to the second sense circuit.

9. The semiconductor integrated circuit according to claim 6, further comprising:
- a first transfer control circuit connected to a gate of the first transfer transistor, the first transfer control circuit controlling a conduction state of the first current path of the first transfer transistor;
- a second transfer control circuit connected to a gate of the second transfer transistor, the second transfer control circuit controlling a conduction state of the second current path of the second transfer transistor; and
- a third transfer control circuit connected to a gate of the third transfer transistor, the third transfer control circuit controlling a conduction state of the third current path of the third transfer transistor.

* * * * *